United States Patent
Lee et al.

(10) Patent No.: US 7,511,998 B2
(45) Date of Patent: Mar. 31, 2009

(54) NON-VOLATILE MEMORY DEVICE AND METHOD OF FABRICATING THE SAME

(75) Inventors: Sung-Young Lee, Yongin-si (KR); Dong-Won Kim, Seongnam-si (KR); Min-Sang Kim, Seoul (KR); Dong-Gun Park, Seongnam-si (KR); Eun-Jung Yun, Seoul (KR)

(73) Assignee: Samsung Electronics Co., Ltd. (KR)

( * ) Notice: Subject to any disclaimer, the term of this patent is extended or adjusted under 35 U.S.C. 154(b) by 122 days.

(21) Appl. No.: 11/803,425

(22) Filed: May 15, 2007

(65) Prior Publication Data

US 2008/0094895 A1 Apr. 24, 2008

(30) Foreign Application Priority Data

Oct. 23, 2006 (KR) .................. 10-2006-0102685

(51) Int. Cl.
*G11C 16/04* (2006.01)

(52) U.S. Cl. .................. 365/185.05; 365/185.01; 365/185.11; 365/185.14; 365/63; 365/182; 257/E21.476; 257/E21.582; 257/368; 257/315; 438/599; 438/524

(58) Field of Classification Search ............ 365/185.05, 365/185.01, 185.11, 185.14, 63, 182; 257/E21.476, 257/E21.582, 368, 315; 438/599, 524

See application file for complete search history.

(56) References Cited

U.S. PATENT DOCUMENTS

| | | | |
|---|---|---|---|
| 4,979,149 A | 12/1990 | Popovic et al. | |
| 5,677,823 A | 10/1997 | Smith | |
| 5,684,314 A * | 11/1997 | Kenney | 257/297 |
| 6,054,745 A | 4/2000 | Nakos et al. | |
| 6,100,109 A | 8/2000 | Melzner et al. | |
| 6,128,214 A | 10/2000 | Kuekes et al. | |
| 6,473,361 B1 | 10/2002 | Chen et al. | |
| 6,509,605 B1 | 1/2003 | Smith | |
| 6,611,033 B2 | 8/2003 | Hsu et al. | |
| 6,781,166 B2 | 8/2004 | Lieber et al. | |
| 6,836,424 B2 | 12/2004 | Segal et al. | |

(Continued)

*Primary Examiner*—Anh Phung
*Assistant Examiner*—Eric Wendler
(74) *Attorney, Agent, or Firm*—Mills & Onello LLP

(57) ABSTRACT

A non-volatile memory device, and method of forming the same, increases or maximizes the performance of an ultramicro-structured device. In one embodiment, a non-volatile memory device comprises a first word line and a second word line insulated from each other and positioned to intersect each other with a vacant space therebetween; a bit line in the vacant space between one of the first word line and the second word line and positioned in parallel with one of the first word line and the second word line, the bit line constructed and arranged to be deflected toward one of the first word line and the second word line by an electric field induced between the first word line and the second word line; and a trap site between the bit line and one of the first word line and the second word line intersecting the bit line, the trap site being insulated from the one of the first word line and the second word line intersecting the bit line and spaced apart from the bit line by a portion of the vacant space, the trap site configured to trap a predetermined electric charge to electrostatically fix the bit line in a deflected position in the direction of the one of the word lines.

20 Claims, 29 Drawing Sheets

U.S. PATENT DOCUMENTS

| | | | |
|---|---|---|---|
| 6,861,685 B2 * | 3/2005 | Choi | 257/288 |
| 6,924,538 B2 | 8/2005 | Jaiprakash et al. | |
| 6,967,373 B2 * | 11/2005 | Choi | 257/321 |
| 7,126,185 B2 * | 10/2006 | Kang et al. | 257/316 |
| 2004/0181630 A1 | 9/2004 | Jaiprakesh et al. | |
| 2004/0238907 A1 | 12/2004 | Pinkerton et al. | |
| 2005/0056877 A1 | 3/2005 | Rueckes et al. | |
| 2008/0061361 A1 * | 3/2008 | Lee et al. | 257/324 |
| 2008/0185668 A1 * | 8/2008 | Kim et al. | 257/415 |

* cited by examiner

NON-VOLATILE MEMORY DEVICE AND METHOD OF FABRICATING THE SAME

CROSS-REFERENCE TO RELATED APPLICATION

This application claims priority to Korean Patent Application No. 10-2006-0102685, filed Oct. 23, 2006, the disclosure of which is hereby incorporated herein by reference in its entirety.

BACKGROUND OF THE INVENTION

1. Technical Field

The present invention relates to a non-volatile memory device and a method of fabricating the same, and more particularly, to a non-volatile memory device, which is capable of writing and reading data by a switching operation of a conductive metal line, and a method of fabricating the same.

2. Discussion of Related Art

Generally, memory devices used for storing data can be classified as volatile memory devices and non-volatile memory devices. Among volatile memory devices, typical memory device types include, for example, a dynamic random access memory (DRAM) or a static random access memory (SRAM). Volatile memory devices are fast in operating speed, for example in inputting and outputting of data, but such devices do not retain stored data when the power supply is removed. Typical non-volatile semiconductor memory device types include, for example, an erasable programmable read only memory (EPROM) or an electrically erasable programmable read only memory (EEPROM). Non-volatile semiconductor memory devices are relatively slow in operation speed, for example in the inputting and outputting of data, but such devices retain stored data when the power supply is discontinued.

Conventional memory devices have been fabricated through the use of metal oxide semiconductor field effect transistors (MOSFET) that are based on metal oxide semiconductor (MOS) technology. For example, stacked-gate type transistor memory devices and trench-gate type transistor memory devices are popular, and advancements on these technology forms have been under development for many years. The stacked gate type transistor memory device includes a gate structure that is stacked on a semiconductor substrate composed of silicon material. The trench gate type transistor memory device includes a gate structure that is embedded in the semiconductor substrate. However, to prevent a short channel effect in a MOSFET device, the width and length of a channel need to be more than a predetermined length, and the thickness of a gate insulating layer, which is formed between a gate electrode positioned at an upper end of the channel and a semiconductor substrate, needs to be extremely thin. Due to these basic limitations, further advancements in MOSFET technology have faced extreme difficulty, especially in nanoscaled structures. Moreover, since a high-temperature process is required for the technology of depositing single-crystalline silicon, which is used as a channel layer under the gate electrode, on a thin film, it is common for the transistor positioned thereunder to become deteriorated, and thus, the stacking process for fabricating the MOSFET is difficult.

In view of the above, research is being actively conducted to develop a memory device having a structure that is an alternative to the MOSFET. In recent years, micro-electromechanical system (MEMS) technology and nano-electromechanical system (NEMS) technology, which have been developed by applying semiconductor technology, have become influential. Among these, a memory device using a carbon nanotube structure is disclosed in US Patent Publication No. 2004/0181630 entitled "Devices having horizontally-disposed nanofabric articles and methods of making the same," incorporated herein by reference.

A conventional memory device in accordance with the above carbon nanotube structure will now be described with reference to FIG. 1, which is a sectional view illustrating a conventional memory device.

As illustrated in FIG. 1, the conventional memory device comprises: a lower electrode 112 and an upper electrode 168 which are spaced apart from each other at a predetermined interval and are parallel in one direction; and a nanotube patch 154 which is spaced away from the lower electrode 112 and the upper electrode 168 and which is configured to deflect between lower and upper electrodes 112, 168, and which stores predetermined data depending on its position being spaced apart from or in contact with, the lower electrode 112 or upper electrode 168.

The lower electrode 112 is embedded in a cavity formed in a first interlayer insulating layer 176 on a semiconductor substrate. For example, the lower electrode 112 is made of conductive metal or semiconductor materials.

The upper electrode 168 is configured to be spaced apart from the lower electrode 112 in a position suspended above the lower electrode 112. The upper electrode 168 is formed to be supported by a second interlayer insulating layer (not shown) that is formed on the first interlayer insulating layer 176.

The nanotube patch 154 is positioned in a center portion of the gap 174 formed between the lower electrode 112 and the upper electrode 168, and can be made to be in contact with the lower electrode 112 or the upper electrode 168, depending on predetermined conditions. For example, the nanotube patch 154 can be anchored on a nitride layer formed on the first interlayer insulating layer 176 at both side edges of the lower electrode 112, so that it is suspended above the lower electrode 112 by a predetermined height. Further, the nanotube patch 154 can deflect to make contact with the lower electrode 112 or the upper electrode 168 to which an electric charge opposite that of an electric charge applied to the nanotube patch 154 is applied. When the nanotube patch 154 comes into contact with the lower electrode 112, the same electric charge as that applied to the nanotube patch 154 is applied to the upper electrode 168 being parallel to the lower electrode 112. In order for the nanotube patch 154 to remain in contact with the lower electrode 112, a sufficient electric charge must be applied to the lower electrode 112. When the nanotube patch 154 comes into contact with the upper electrode 168, the opposite electric charge to that applied to the nanotube patch 154 is applied to the upper electrode 168, and the same electric charge as that applied to the nanotube patch 154 is applied to the lower electrode 112.

Accordingly, the conventional memory device described above can store one bit of data, the state of the bit corresponding to the state, or position, of the nanotube patch 154 in the gap between the lower electrode 112 and the upper electrode 168; that is, whether the nanotube patch is in a position in contact with the lower electrode 112 or upper electrode 168, respectively, or whether the nanotube patch is in a suspended state in the gap, 174, not in contact with either of the lower electrode 112 or upper electrode 168.

However, the conventional memory device described above has the following problems.

First, in the conventional memory device, to maintain the state that the nanotube patch 154 is in contact with the lower electrode 112 or upper electrode 168, a predetermined electric charge must be continuously supplied to the nanotube patch 154 and the lower electrode 112 or upper electrode 168 being in contact with the nanotube patch 154, thereby increasing standby power consumption. When the electric charge supply is discontinued, the nanotube patch will recover to its original state, and any written information corresponding to the position of the nanotube patch 154 is lost; therefore, a non-volatile memory device cannot be realized using this technology.

Second, in the conventional memory device, when the nanotube patch 154 in contact with the lower electrode 112 or upper electrode 168 needs to be separated therefrom, a van der Waal's force is operable between the patch 154 and the lower electrode 112 or upper electrode 168 which is made of a conductive metal material. Accordingly, the nanotube patch 154 is not always separated from the lower electrode 112 or upper electrode 168 and thus, writing of information cannot be clearly performed, thereby deteriorating reliability of the memory device.

SUMMARY OF THE INVENTION

An object of the present invention is to provide a non-volatile memory device which reduces consumption of standby power to maintain information to be written and which prevents loss of the information even in the case where the supply of an external electric charge is removed, thereby improving or maximizing the productivity of the memory device. Another object of the present invention is to provide a method of fabricating a non-volatile memory device having these characteristics.

In one aspect, a non-volatile memory device comprises: a first word line and a second word line insulated from each other and positioned to intersect each other with a vacant space therebetween; a bit line in the vacant space between the first word line and the second word line and positioned in parallel with one of the first word line and the second word line, the bit line constructed and arranged to be deflected toward one of the first word line and the second word line by an electric field induced between the first word line and the second word line; and a trap site between the bit line and one of the first word line and the second word line intersecting the bit line, the trap site being insulated from the one of the first word line and the second word line intersecting the bit line and spaced apart from the bit line by a portion of the vacant space, the trap site configured to trap a predetermined electric charge to electrostatically fix the bit line in a deflected position in the direction of the one of the word lines.

In one embodiment, the non-volatile memory device further comprises: a substrate on which one of the first and second word lines is formed; a first interlayer insulating layer that supports the bit line in a position that is spaced apart from, and above, the one of the first and second word lines and the trap site formed on the substrate; and a second interlayer insulating layer that supports the other of the first and second word lines.

In another embodiment, the trap site has a structure in which a first silicon oxide layer, a silicon nitride layer and a second silicon oxide layer are stacked.

In another aspect, a non-volatile memory device comprises: a substrate; a first word line on the substrate and extending in a first direction; a second word line insulated from the first word line and positioned to extend in a second direction so as to intersect the first word line, the second word line being spaced apart from the first word line by a vacant space; a first interlayer insulating layer and a second interlayer insulating layer on the substrate at sides of the first word line which support the second word line at a height above the first word line; a bit line in the vacant space above the first word line between the first and second interlayer insulating layers, the bit line extending in the second direction so as to intersect the first word line, the bit line constructed and arranged to be deflected in a direction toward one of the first word line and the second word line in response to a predetermined condition; and a trap site on the first word line under the bit line and spaced apart from the bit line by the vacant space, the trap site configured to trap a predetermined electric charge to electrostatically fix the bit line in a deflected position in the direction of the first word line.

In one embodiment, the substrate comprises an insulating substrate or a semiconductor substrate.

In another embodiment, at least one of the first word line and the second word line comprises gold, silver, copper, aluminum, tungsten, tungsten silicide, titanium, titanium nitride, tantalum or tantalum silicide.

In another embodiment, at least one of the first interlayer insulating layer and the second interlayer insulating layer comprises a silicon oxide layer formed by a TEOS, USG, SOG or HDP-CVD method.

In another embodiment, the non-volatile memory device further comprises: a first sacrificial layer which is formed between the first word line and the bit line and is removed to form the vacant space; and a second sacrificial layer which is formed between the bit line and the second word line and is removed to form the vacant space.

In another embodiment, the first sacrificial layer and the second sacrificial layer comprise a polysilicon material.

In another embodiment, the non-volatile memory device further comprises a trench which exposes the first sacrificial layer and the second sacrificial layer by removing the second interlayer insulating layer in a region that does not interfere with the intersection region of the first word line and the second word line.

In another embodiment, the non-volatile memory device further comprises a third interlayer insulating layer which electrically insulates the second word line on the second interlayer insulating layer and buries the trench.

In another embodiment, the bit line comprises titanium, a titanium nitride layer, or a carbon nanotube.

In another embodiment, the trap site has a structure in that a first silicon oxide layer formed on the first word line, a silicon nitride layer and a second silicon oxide layer are stacked.

In another embodiment, the non-volatile memory device further comprises a spacer which is formed on the bit line, to allow the bit line to be spaced apart from the second word line which does not interfere with the first word line, by a predetermined interval.

In another aspect, a method of fabricating a non-volatile memory device, comprises: forming a first word line, a trap site and a first sacrificial layer to extend in a first direction on a substrate; forming a first interlayer insulating layer at sidewalls of the first word line, the trap site and the first sacrificial layer; forming a bit line on the first sacrificial layer and the first interlayer insulating layer, to extend in a second direction across the first word line, the trap site and the first sacrificial layer; forming a second sacrificial layer covering the bit line; forming a second interlayer insulating layer burying the second sacrificial layer to a predetermined thickness on the substrate where the second sacrificial layer is formed; forming a second word line on the second sacrificial layer by removing the second interlayer insulating layer on the second sacrificial layer; forming a trench exposing the first sacrificial layer and the second sacrificial layer on the first word line in a region that does not interfere with the second word line; and forming a vacant space between the bit line and the trap site on the first word line and between the bit line and the second word line by removing the first sacrificial layer and the second sacrificial layer exposed by the trench.

In one embodiment, the first interlayer insulating layer is formed by forming a silicon oxide layer to bury the first word line, the trap site and the first sacrificial layer, and by removing the silicon oxide layer to be flattened so that the first sacrificial layer is exposed.

In another embodiment, the method further comprises forming a spacer by retaining a portion of the second interlayer insulating layer on the second sacrificial layer that does not interfere with the first word line, so that the bit line and the second word line are maintained to be spaced apart from each other by a predetermined distance, when the second sacrificial layer is removed.

In another embodiment, the second word line is formed by a damascene method.

In another embodiment, the first sacrificial layer and the second sacrificial layer exposed by the trench are removed by a wet etching method or a dry etching method having an isotropic etching characteristic.

In another embodiment, the method further comprises: forming a third interlayer insulating layer to bury the trench on the second interlayer insulating layer and the second word line.

BRIEF DESCRIPTION OF THE DRAWINGS

The above and other features and advantages of the present invention will become more apparent to those of ordinary skill in the art by describing in detail embodiment(s) thereof with reference to the attached drawings in which.

DETAILED DESCRIPTION OF EMBODIMENTS

Figure 1:
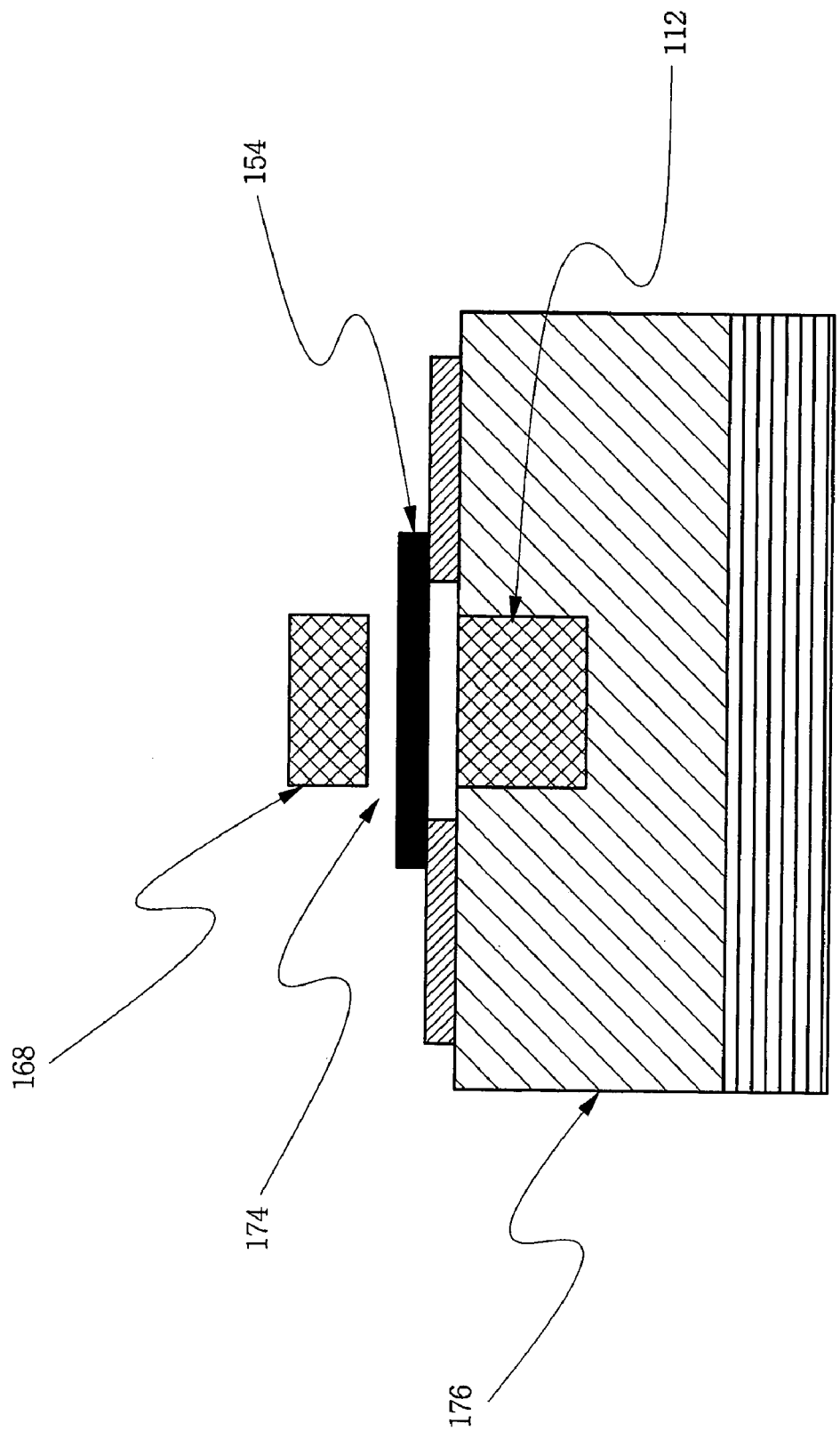
FIG. 1 is a sectional view illustrating a conventional memory device.

Embodiments of the present invention will now be described more fully hereinafter with reference to the accompanying drawings, in which a preferred embodiment(s) of the invention is shown. This invention may, however, be embodied in many different forms and should not be construed as being limited to the embodiment(s) set forth herein. Rather, the embodiment(s) are provided so that this disclosure will be thorough and complete, and will fully convey the scope of the invention to those skilled in the art. In the drawings, the thicknesses of layers and regions are exaggerated for clarity. When one layer is described as being positioned 'on' or 'above' the other layer or a substrate, the layer may be positioned to be directly in contact with the other layer or the substrate, or a third layer may be positioned therebetween.

Figure 2:
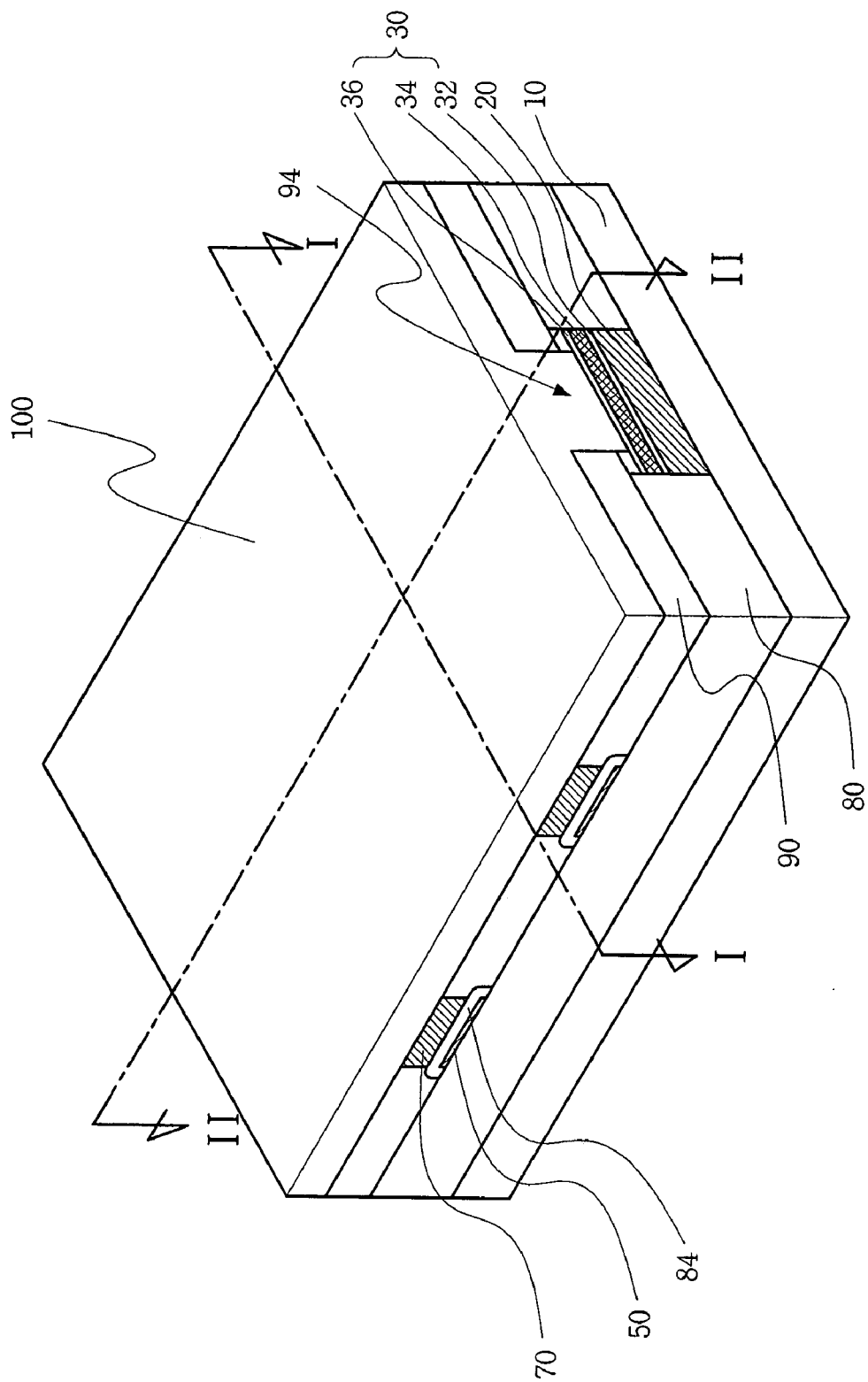
FIG. 2 is a perspective view illustrating a non-volatile memory device according to an embodiment of the present invention.
Figure 3:
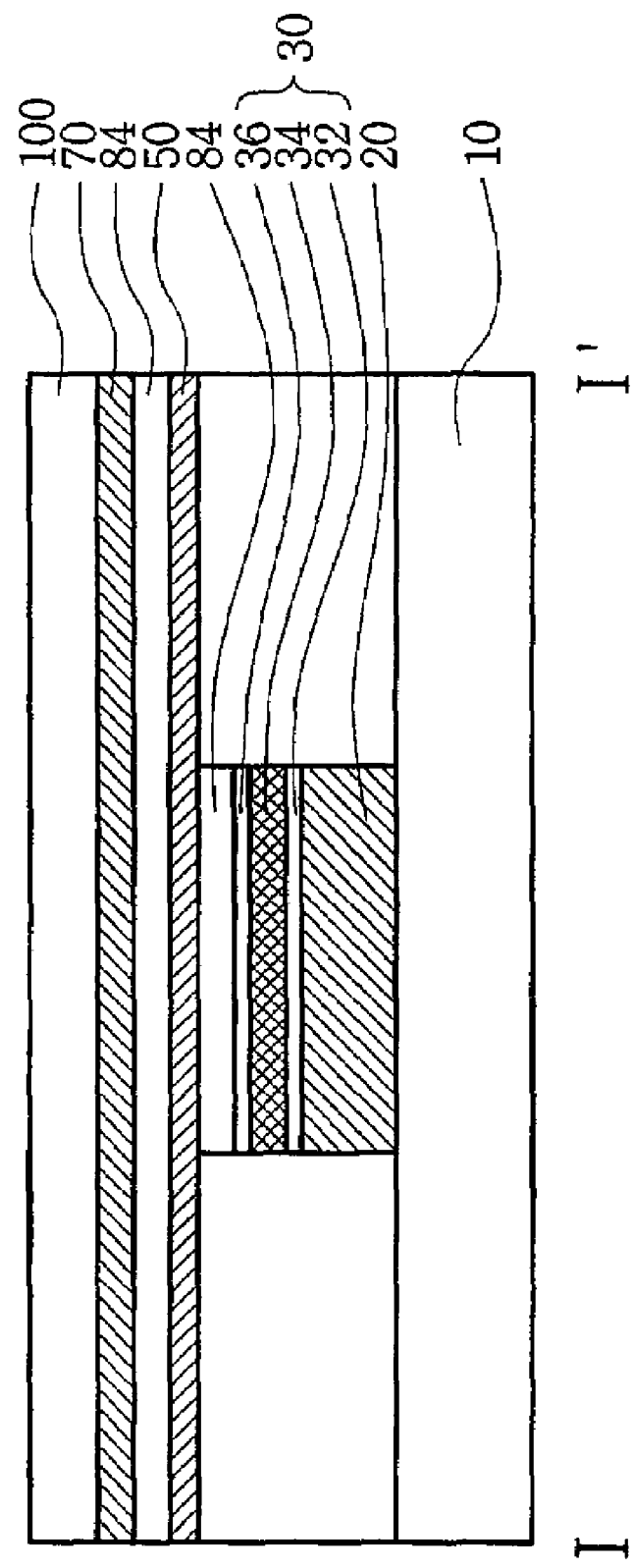
FIG. 3 is a sectional view taken along Line I~I' of FIG. 2.
Figure 4:
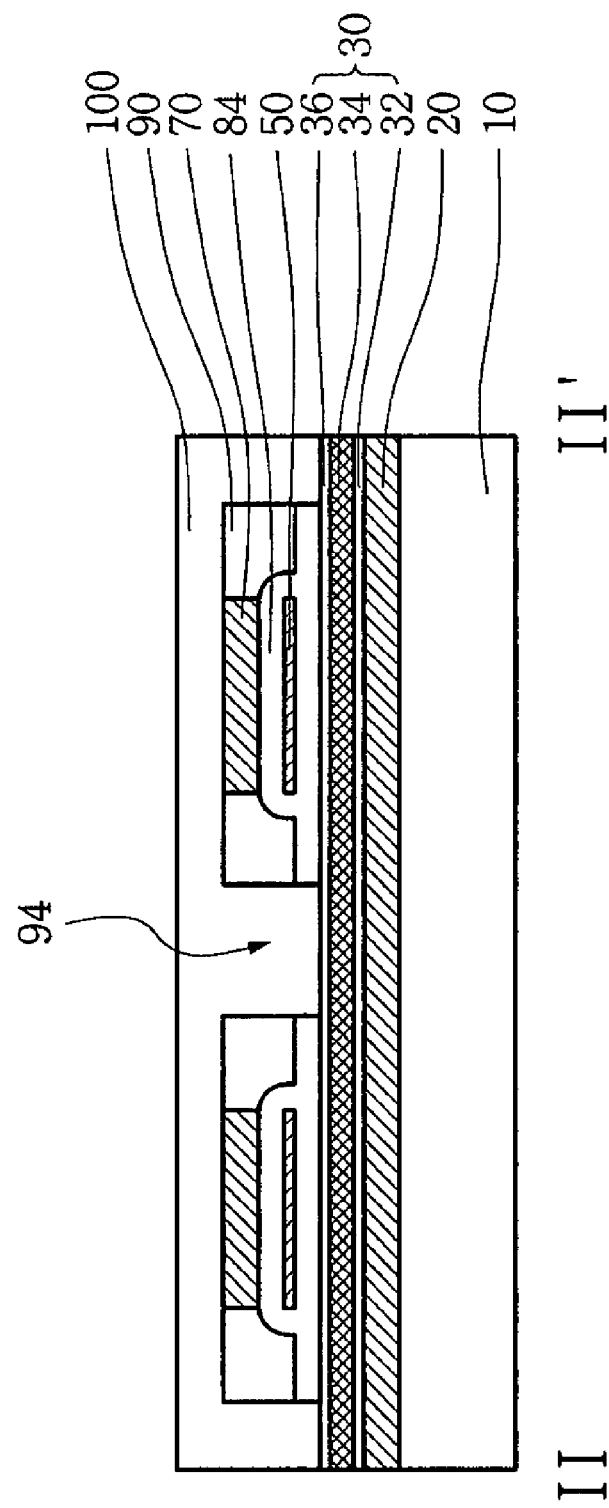
FIG. 4 is a sectional view taken along Line II~II' of FIG. 2.

FIG. 2 is a perspective view illustrating a non-volatile memory device according to an embodiment of the present invention, FIG. 3 is a sectional view taken along Line I~I' of FIG. 2, and FIG. 4 is a sectional view taken along Line II~II' of FIG. 2.

As illustrated in FIGS. 2 through 4, the non-volatile memory device comprises a write word line (for example, a first word line) 20 and a read word line (for example a second word line) 70. A vacant space 84, at a predetermined interval, is defined between the write word line 20 and the read word line 70. The write word line 20 and the read word line 70 cross over, or intersect, each other spatially in different planes. The write word line 20 is formed to a predetermined thickness, on a substrate 10 having a flat upper surface. For example, the substrate 10 may comprise an insulating substrate or a semiconductor substrate having high flexibility. The write word line 20 and the read word line 70 may be made of a high conductive metal material, such as gold, silver, copper, aluminum, tungsten, tungsten silicide, titanium, titanium nitride, tantalum or tantalum silicide, or a crystalline silicon or poly silicon material which is doped with conductive impurities. The read word line 70 is spaced apart from the write word line 20 by a predetermined distance and crosses over, or intersects, the write word line 20 in different planes. The read word line 70 is supported by a first interlayer insulating layer 80 and a second interlayer insulating layer 90 formed on the substrate 10. The first interlayer insulating layer 80 and the second interlayer insulating layer 90 are respectively formed to insulate the side portions of the write word line 20 and the read word line 70. For example, the first interlayer insulating layer 80 and the second interlayer insulating layer 90 include a silicon oxide layer formed by the TEOS, USG, SOG, or HDP-CVD method.

Further, a bit line 50 is formed between the first interlayer insulating layer 80 and the second interlayer insulating layer 90 in the same direction as that of the read word line 70. The bit line 50 passes through a middle region of the vacant space 84 between the write word line 20 and the read word line 70. The bit line 50 is configured to deflect in a perpendicular direction relative to the write word line 20 and the read word line 70 in the space between the write word line 20 and the read word line 70. When a first sacrificial layer (not shown in FIGS. 2 through 4 and shown below as reference number 40 of FIG. 7A) stacked between the write word line 20 and the bit line 50 is removed, and a second sacrificial layer (not shown in FIGS. 2 through 4 and shown below as reference number 60 of FIG. 7E) stacked between the bit line 50 and the read word line 70 is removed, the vacant space 84 is formed. The first sacrificial layer 40 and the second sacrificial layer 60 are composed of a poly silicon material. The first sacrificial layer 40 or second sacrificial layer 60 may be removed when it is exposed by a trench (94 of FIG. 7I) formed above the write word line 20 in a region where the write word line 20 and the read word line 70 do not cross over each other. Since the read word line 70 and the bit line 50 need to be insulated from each other, a spacer (not shown) can then be formed between the read word line 70 and the bit line 50, where the bit line 50 and the write word line 20 do not cross each other. The bit line 50 has predetermined elasticity, to allow for its deflection into the vacant space 84 between the write word line 20 and the read word line 70. For example, the bit line 50 can be composed of titanium, titanium nitride, or a carbon nanotube material. In a case where a carbon nanotube is employed for the bit line, the carbon nanotube has a tube shape in which hexagonal shapes being respectively formed of six atoms of carbon are linked to one another. The tube is only a few of nanometers to several tens of nanometers in diameter. The name, carbon nanotube, is derived from the length. The carbon nanotube is similar to copper in electric conductivity and is same as diamond in thermal conductivity, where diamond has the highest known thermal conductivity. The carbon nanotube is one-hundred times greater than steel in strength. While a carbon fiber can fracture with only 1% deformation, a carbon nanotube has resiliency, and resists fracture, through up to 15% deformation.

Further, a trap site 30 is formed to extend in the direction of the write word line 20 between the bit line 50 and the write word line 20. The trap site 30 is capable of trapping a predetermined electric charge which is applied from the write word line 20 or from an external source, to electrostatically fix the bit line 50 which is deflected in the direction of the write word line 20. The electric charge, which is applied through the write word line 20, is tunneled to be trapped in the trap site 30. In a case where power is removed from the device, and there is no electric charge being supplied from an external source, the trap site 30 continuously binds (restricts) the electric charge being trapped. For example, the trap site 30 includes a thin film having an 'oxide-nitride-oxide (ONO)' structure in which a first silicon oxide layer 32, a trap silicon nitride layer 34 and a second silicon oxide layer 36 are stacked on the write word line 20. Accordingly, when a predetermined electric current is applied to the write word line 20, the electric charge being tunneled through the first silicon oxide layer 32 by the electric current is trapped in the trap silicon nitride layer 34. When an electric charge, which has a polarity opposite to that of the electric charge being trapped in the trap site 30, is supplied to the bit line 50 above the trap site 30, the bit line 50 is moved to deflect in the direction of the trap site 30. However, when an electric charge, which has the same polarity as that of the electric charge being trapped in the trap site 30, is supplied to the bit line 50 above the trap site 30, the bit line 50 is moved to deflect in the direction of the read word line 70 above the trap site 30. Then, the direction in which the bit line 50 is moved is indicated by the Coulomb force F which is expressed as Formula 1 below:

$$F = -k\frac{q_1 q_2}{r^2}$$ [Formula 1]

wherein, k is the Coulomb constant, $q_1$ is the electric charge applied to the bit line 50, $q_2$ is the electric charge applied to the trap site 30 and the write word line 20. r is the distance in a straight line between the trap site 30 and the bit line 50 or the, write word line 20 and the bit line 50. Based on the Coulomb force, when $q_1$ has the opposite polarity to the polarity of $q_2$, an attractive force operates so that $q_1$ and $q_2$ become closer to each other. However, when $q_1$ has the same polarity as the polarity of $q_2$, a repulsive force operates so that $q_1$ and $q_2$ become farther apart from each other. Accordingly, when electric charge of opposite polarity are respectively applied to the trap site 30 and the bit line 50, the bit line 50 deflects in the direction of the trap site 30. Then, the electric charge of the same polarity as that of the electric charge applied to the bit line 50 can be applied to the read word line 70.

Further, when the bit line 50 is deflected in the direction of the trap site 30 to come in contact with, or come close to, the trap site 30, since the distance r between the trap site 30 and the bit line 50 is shorter, the Coulomb force operating as the attractive force becomes greater. Then, even when the electric charge applied to the write word line 20 under the trap site 30 is removed, a predetermined electric charge is induced from the bit line 50 by the electric charge trapped in the trap site 30, so that the bit line 50 remains in the deflected state. Since the electrostatic force, which is a typical example of the Coulomb force, operates several tens of thousands of times more strongly than general elasticity or resiliency of the material of the bit line, the electrostatic connection of the trap site 30 and the bit line 50 is not easily broken by the elasticity or resiliency of the bit line material. Actually, in realizing a nanoscaled ultramicro-scaled device, which is smaller than microscaled, the Coulomb force has a strength that is inversely proportional to the square of the distance r; however, the elasticity or resiliency of the material has a strength that is proportional to the simple distance r. Accordingly, it is expressed that the bit line 50 having an ultramicro structure is moved in the direction of the trap site 30 or in the direction of the read word line 70 by the Coulomb force without the resiliency. Further, even though there is no electric charge applied to the write word line 20 and the bit line 50, the electric charge having polarity opposite to that of the electric charge of the trap site 30 is induced in the bit line 50 by an electric field caused by the electric charge trapped in the trap site 30, so that the trap site 30 and the bit line 50 are maintained to be close to each other. Further, even though a predetermined electric current (or less) is continuously supplied to only the bit line 50, the electric current is bound to the electric field caused by the electric charge of the trap site 30 so that the bit line 50 may be continuously maintained to be in close proximity to the trap site 30.

Accordingly, the non-volatile memory device according to the embodiment of the present invention allows the read word line 70 to output information corresponding to one bit, by respectively distinguishing the first position of the bit line 50 being in close proximity to, or being in contact with, the trap site 30, and the second position of the bit line 50 being separated and spaced apart from the trap site 30.

For example, the information is output, corresponding to first electric potential (a first voltage) which is proportional to the electric field strength induced between the read word line 70 and the bit line 50 being in close proximity to, or being in contact with, the trap site 30, and second electric potential (a second voltage) which is proportional to the electric field strength induced between the bit line 50 separated and spaced apart from the trap site 30 and the read word line 70. The first electric potential is smaller in value, as compared to the second electric potential. When reading predetermined information in the bit line 50 spaced apart from the trap site 30, the electrostatic attractive force operates between the bit line 50 and the read word line 70, so that the bit line 50 may be deflected in the direction of the read word line 70.

Consequently, the non-volatile memory device according to the embodiment of the present invention comprises the trap site 30 which allows the electric charge applied to the write word line 20 to be tunneled and trapped and which continuously maintains the deflected state of the bit line 50, using the trapped electric charge, thereby reducing the consumption of the standby power which otherwise would need to be applied for storing information, and thereby preventing the information from being lost, even when no electric charge is supplied to the write word line 20, to increase or maximize productivity and efficiency of the device.

Figure 5:
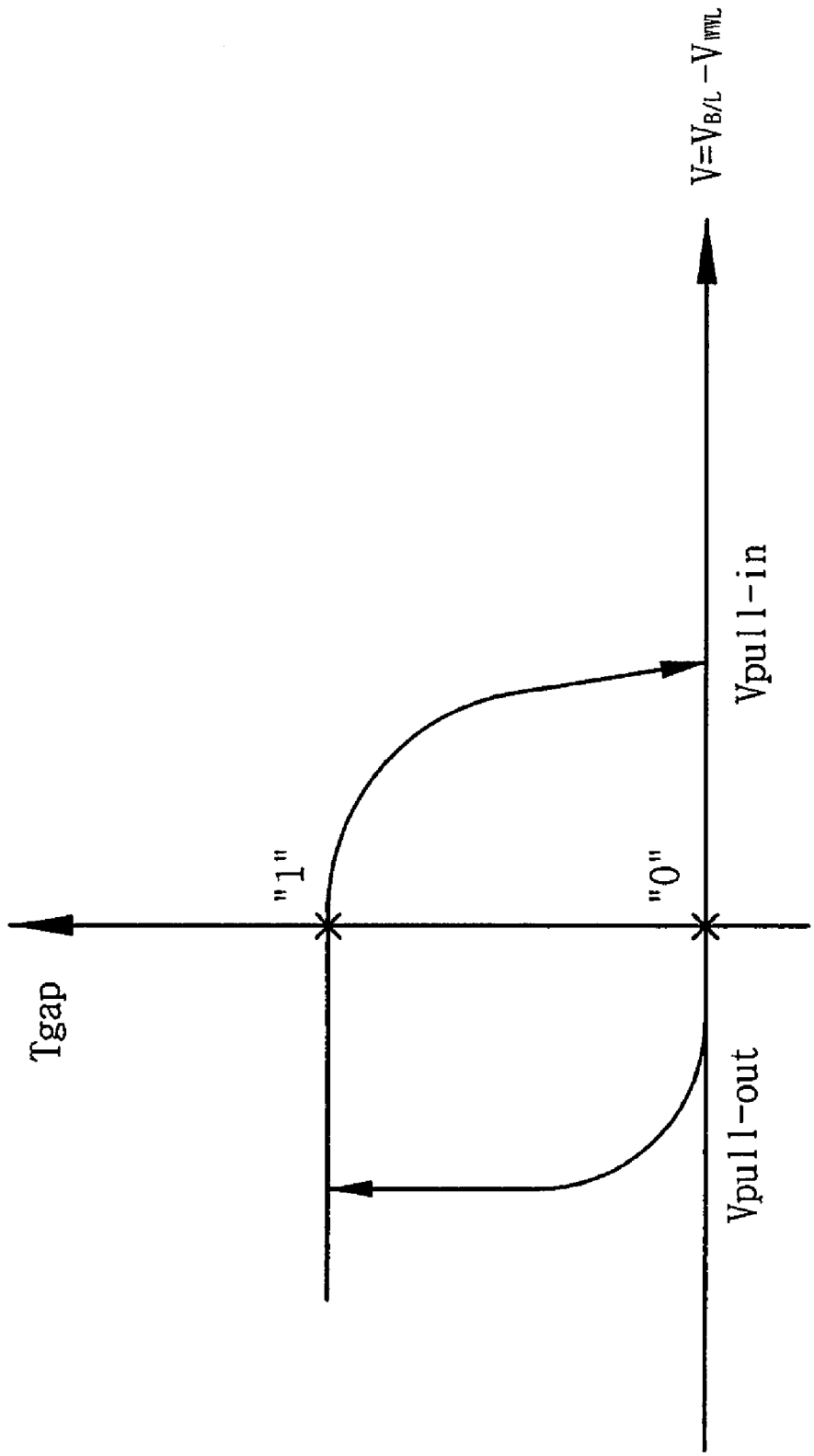
FIG. 5 is a graph illustrating a relation between a voltage, which is applied to a bit line and a write word line, and a deflection distance of the bit line, in accordance with an embodiment of the present invention.

FIG. 5 is a graph illustrating a relation between a voltage, which is applied to the bit line 50 and the write word line 20 of FIG. 2, and a deflection distance of the bit line 50. When the voltage having positive value, '$V_{pull-in}$', is applied between the bit line 50 and the write word line 20, the bit line 50 and the trap site 30 become closer to each other so that the information corresponding to '0' is written. When the voltage having negative value, '$V_{pull-out}$', is applied between the bit line 50 and the write word line 20, the bit line 50 and the trap site 30 become farther apart from each other so that the information corresponding to '1' is written. The horizontal axis indicates the extent of voltage, and the vertical axis indicates the distance $T_{gap}$ which the bit line 50 is moved from the surface of the trap site 30 to the read word line 70. The bit line 50 is in contact with or is spaced apart from the trap site 30 depending on the extent of the voltage induced between the bit line 50 and the write word line 20, so that the digital information corresponding to one bit having '0' or '1' in value is written. The voltage of '$V_{pull-in}$' and the voltage of '$V_{pull-out}$' are determined by Formula 2 below:

$$V=V_{B/L}-V_{WWL} \quad \text{[Formula 2]}$$

wherein, 'V' is the voltage of '$V_{pull-in}$' or the voltage of '$V_{pull-out}$', '$V_{B/L}$' is the voltage applied to the bit line 50, and '$V_{WWL}$' is the voltage applied to the write word line 20. The voltage of '$V_{pull-in}$' has a positive value, and the voltage of '$V_{pull-out}$' has a negative value. For example, when the absolute values of the voltage of '$V_{pull-in}$' and the voltage of '$V_{pull-out}$' are the same, or similar to, each other and when the information corresponding to the value of '0' is to be written, the bit line 50 can be made to be in contact with the trap site 30, by applying ½ of the voltage of '$V_{pull-in}$' to the bit line 50 and ½ of the voltage of '$V_{pull-out}$' to the write word line 20.

Further, when the information corresponding to '1' is to be written, the bit line 50 can be made to be spaced apart from the trap site 30, by applying ½ of the voltage of '$V_{pull-out}$' to the bit line 50 and ½ of the voltage of '$V_{pull-in}$' to the write word line 20. Adjacent bit line 50, write word line 20 and read word line 70 to which the voltage of '$V_{pull-in}$' or the voltage of '$V_{pull-out}$' is not applied may be set to be grounded (not shown).

When the bit line 50 is close to the trap site 30, the bit line 50 is bent to be deflected in a downward direction. Then, since the bit line 50 is insulated by the second silicon oxide layer 36 of the trap site 30, the bit line 50 does not make direct contact with the write word line 20 made of a conductive metal element, the trap silicon nitride layer 34 of the trap site 30, or the poly silicon layer. Accordingly, since the bit line 50 and the trap site 30 are insulated from each other, the van der Waal's force due to the contact with a conductive metal does not operate, unlike a conventional technique. Even though no electric charge is applied to the bit line 50, the contact is made based on only the Coulomb force which is generated by the electric charge induced corresponding to the electric charge trapped in the trap site 30. When the electric charge trapped in the trap site 30 is removed, the Coulomb force is removed and the bit line 50 becomes once again separated from the trap site 30 by the elasticity or resiliency of the bit line 50.

Consequently, the non-volatile memory device according to the embodiment of the present invention includes the trap site 30 which is in contact with the bit line 50 when the bit line deflects in a downward, vertical, direction and which is formed to insulate the bit line 50, thereby clearly writing or erasing the information corresponding to whether or not the bit line 50 is in contact with the trap site 30, to increase or maximize the reliability of the device.

Figure 6:
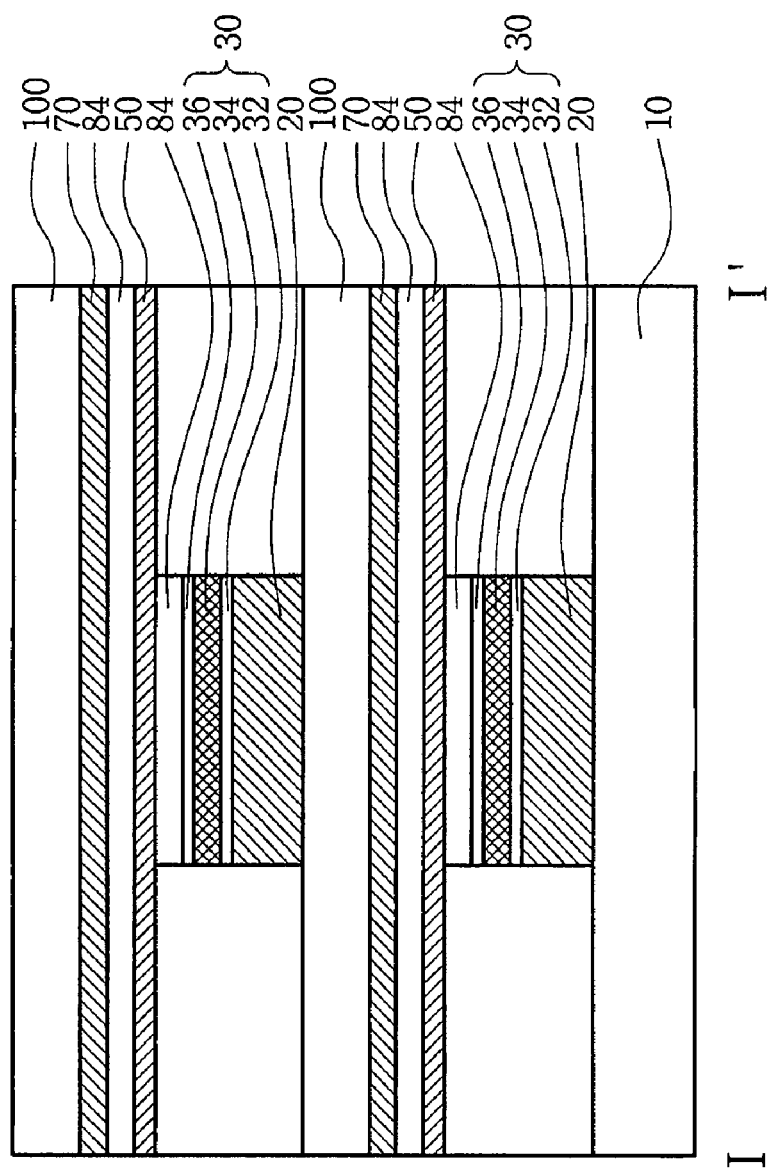
FIG. 6 is a sectional view illustrating a stacked device structure in which a plurality of the non-volatile memory devices of FIG. 2 are stacked.

FIG. 6 is a sectional view illustrating a stacked device structure in which a plurality of the non-volatile memory devices of FIG. 2 are stacked.

A plurality of non-volatile memory devices, each including the trap site 30 to electrostatically fix the bit line 50 being deflected in a perpendicular direction between the write word line 20 and the read word line 70 which cross, or intersect, each other in different planes, are sequentially stacked. A plurality of write word lines 20 are formed in the same direction, and a plurality of read word lines 70 are formed in the same direction. A third interlayer insulating layer 100 formed on the read word line 70 is positioned between the plurality of non-volatile memory devices. The third interlayer insulating layer 100 is formed to bury the trench 94 which exposes the first sacrificial layer 40 and the second sacrificial layer 60 being removed to form the vacant space 84 between the read word line 70 and the trap site 30, as will be described in detail below.

Even though not shown in the figure, the plurality of write word lines 20 and the plurality of read word lines 30 may be formed to respectively cross over one another. Switching devices, such as at least one or more transistors to control the voltage applied to the non-volatile memory devices, may be positioned at the perimeter of the array of the non-volatile memory devices. Further, different devices, such as a MOS transistor, a capacitor, or a resistor, may be positioned at regions neighboring the non-volatile memory devices, as needed to complete the resulting integrated circuit.

Consequently, the non-volatile memory device according to the embodiment of the present invention includes the trap site 30 which is an active element capable of performing a switching operation by the electric interconnection such as the write word line 20, the read word line 70 and the bit line 50 and which is formed to electrostatically fix the state in which the bit line 50 is deflected, thereby retaining the information corresponding to one bit of information that depends on the deflection state of the bit line 50.

A method of fabricating the non-volatile memory device according to an embodiment of the present invention will now be described.

FIGS. 7A-7K, 8A-8K and 9A-9K are perspective views and sectional views for explaining the method of fabricating the non-volatile memory device of FIGS. 2 through 4. Since the sectional views of FIGS. 8A through 8K and 9A through 9K are sectioned from the perspective views of FIGS. 7A through 7K and are sequentially presented, some of drawings may be repeated to clearly explain the process sequence.

Figure 7A:
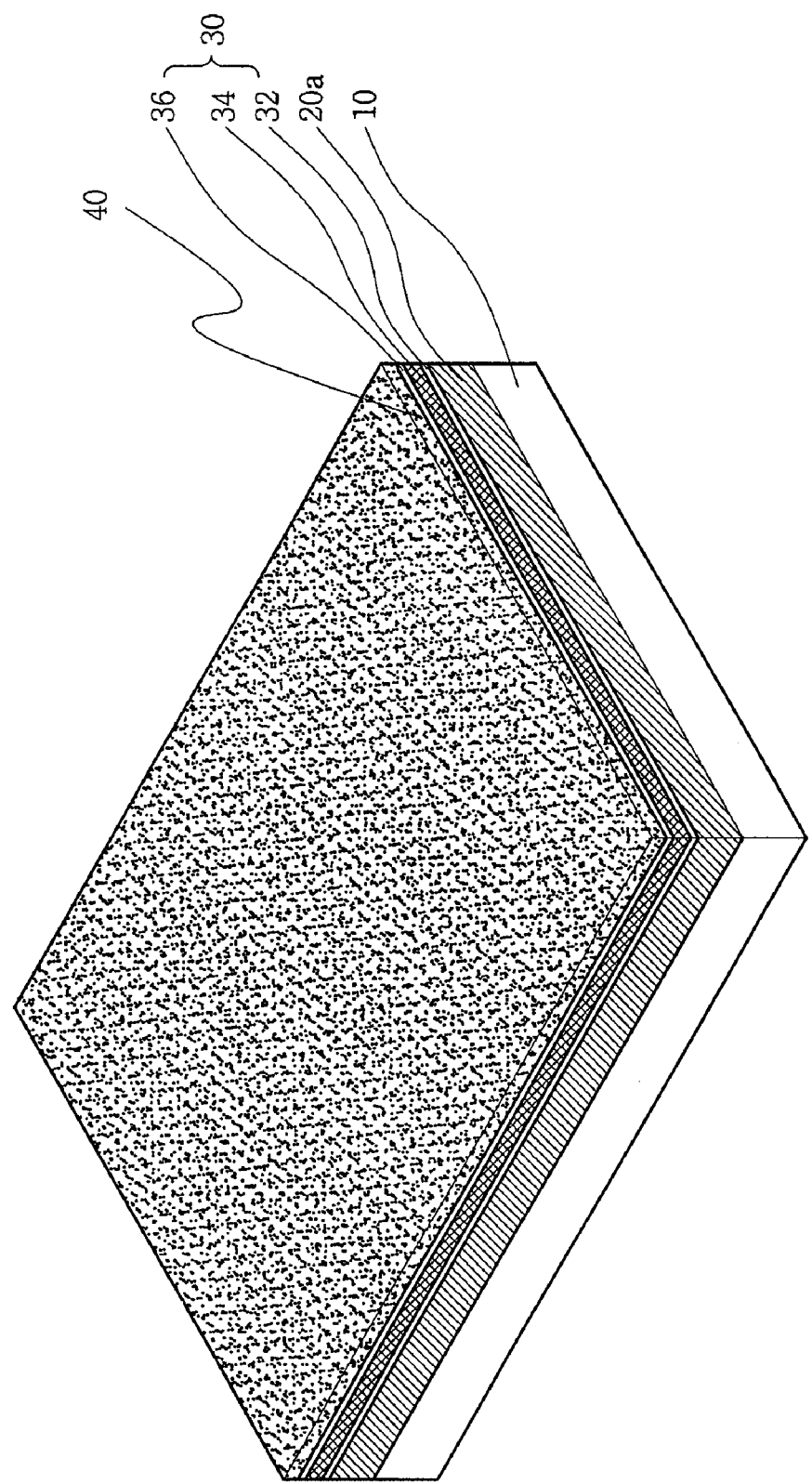
FIGS. 7A-7K, 8A-8K and 9A-9K are perspective views and sectional views for explaining a method of fabricating the non-volatile memory device of FIGS. 2 through 4.
Figure 8A:
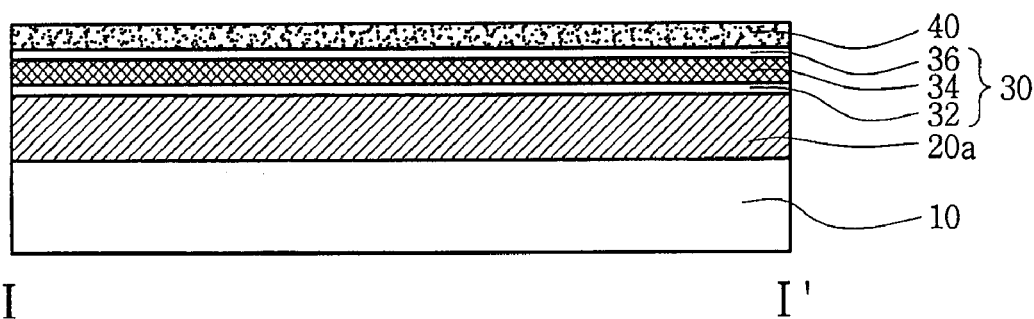
Figure 9A:
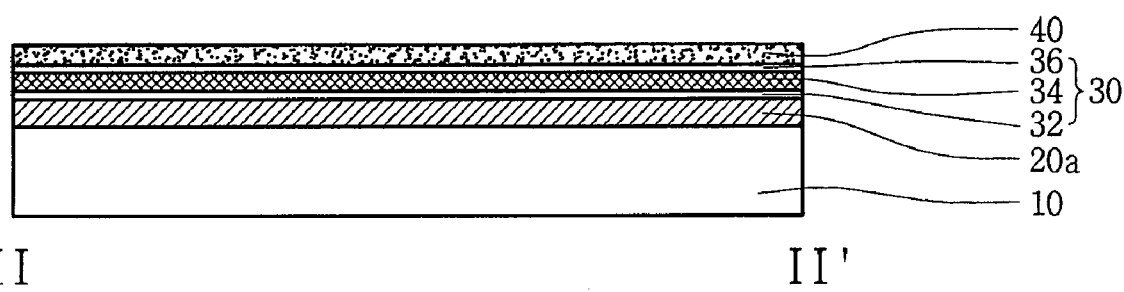

As illustrated in FIGS. 7A, 8A and 9A, the non-volatile memory device according to the embodiment of the present invention includes a conductive metal layer 20a, a first silicon oxide layer 32, a trap silicon nitride layer 34, a second silicon oxide layer 36 and a first sacrificial layer 40 which are sequentially stacked, to their respective predetermined thicknesses, on a substrate 10 positioned horizontally. Since the conductive metal layer 20a does not have the directionality of crystal growth, an insulating substrate of high flexibility or a semiconductor substrate may be Used as the substrate 10. The conductive metal layer 20a, the first silicon oxide layer 32, the trap silicon nitride layer 34, the second silicon oxide layer 36 and the first sacrificial layer 40 are sequentially formed, to their respective predetermined thicknesses, by at least one of a chemical vapor deposition method, a physical vapor deposition method and a thermal oxidation method. For example, the conductive metal layer 20a is composed of a metal material, such as gold, silver, copper, aluminum, tungsten, tungsten silicide, titanium, titanium nitride, tantalum or tantalum silicide, and is formed to a thickness of about 200 to 500 Å by the physical vapor deposition method or chemical vapor deposition method. The first silicon oxide layer 32 and the second silicon oxide layer 36 are formed to a thickness of about 30 to 200 Å by the thermal oxidation method or chemical vapor deposition method. The trap silicon nitride layer 34 is formed to a thickness of about 50 to 300 Å by the chemical vapor deposition method. The first sacrificial layer 40 is composed of a poly silicon layer and is formed to a thickness of about 10 to 300 Å by the chemical vapor deposition method.

Figure 7B:
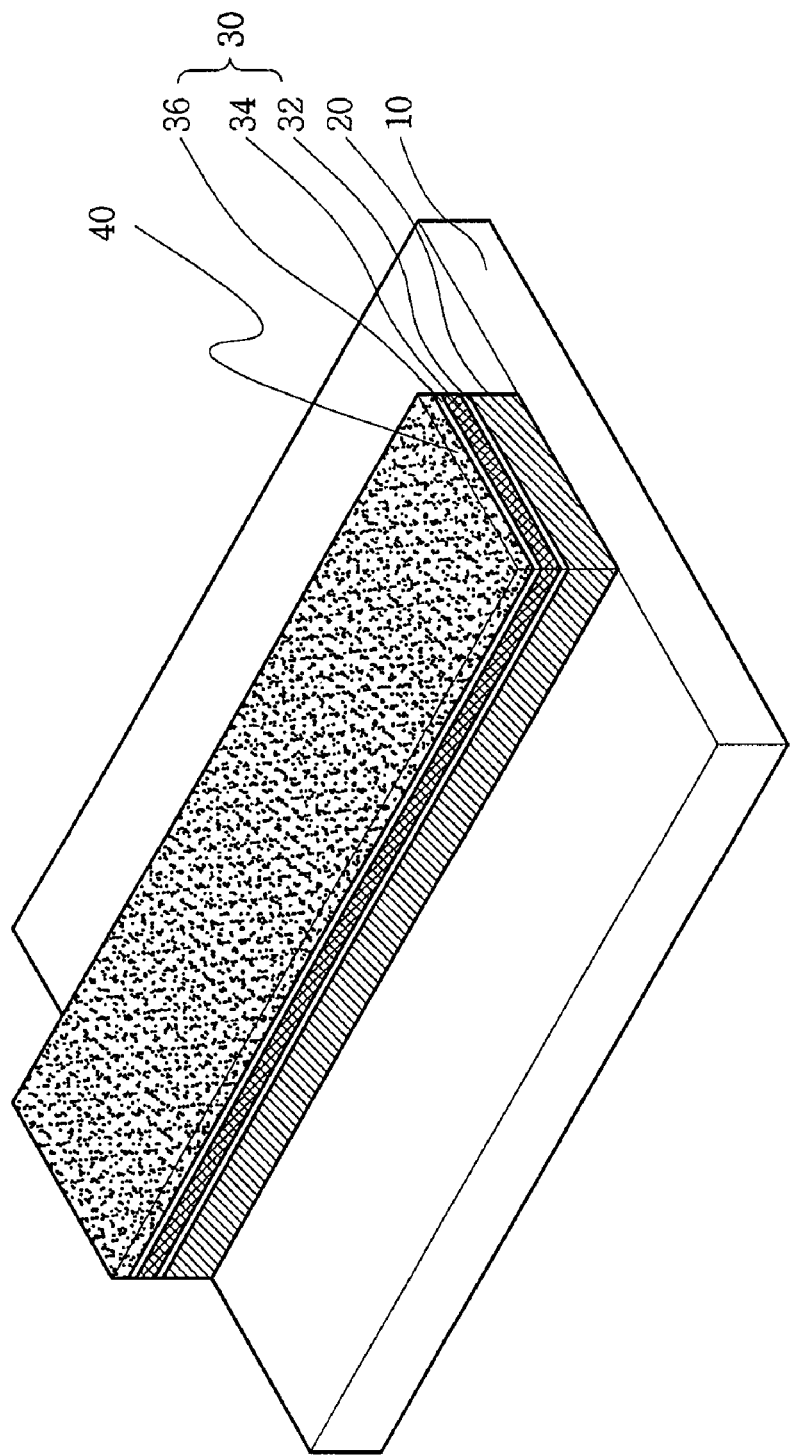
Figure 8B:
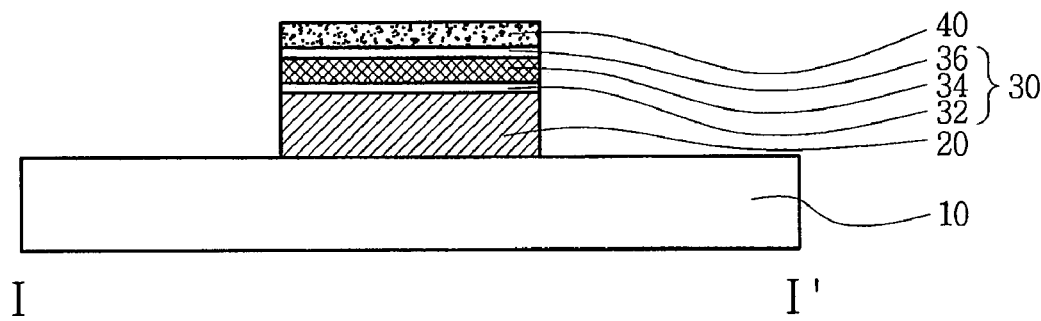
Figure 9B:
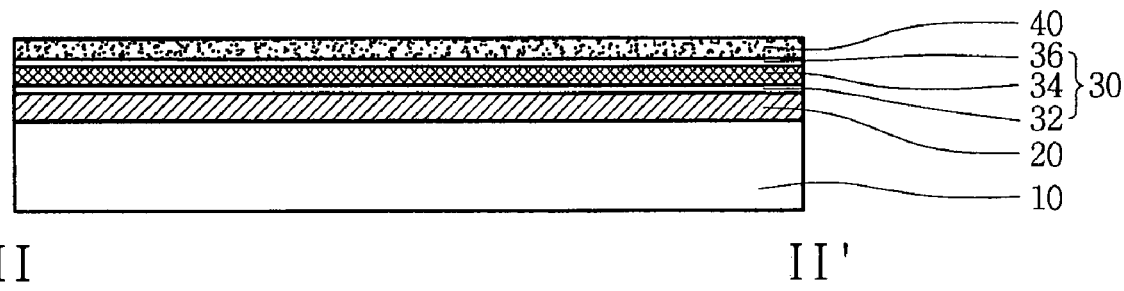

As illustrated in FIGS. 7B, 8B and 9B, the conductive metal layer 20a, the first silicon oxide layer 32, the trap silicon nitride layer 34 and the second silicon oxide layer 36 are patterned to extend on the substrate in a first direction. The conductive metal layer 20a patterned to extend in the first direction forms a write word line 20. The first silicon oxide layer 32, the trap silicon nitride layer 34 and the second silicon oxide layer 36 form a trap site 30 in the 'ONO' structure. The first sacrificial layer 40 is removed in subsequent steps to later form a predetermined vacant space 84 under a bit line 50 which will be formed subsequently. For example, a process of patterning the write word line 20, the trap site 30 and the first sacrificial layer 40 is performed by applying photo-resist on the first sacrificial layer 40; patterning the photo-resist in the first direction; and etching the first sacrificial layer 40, the second silicon oxide layer 36, the trap silicon nitride layer 34, the first silicon oxide layer 32 and the conductive metal layer sequentially, using the photo-resist pattern as an etching mask. A patterning process may be performed by forming a hard mask layer (not shown), such as a silicon nitride layer or a silicon oxide layer, on the first sacrificial layer 40; forming a photo-resist pattern; patterning the hard mask layer; removing the photo-resist pattern; and then removing the first sacrificial layer 40, the second silicon oxide layer 36, the trap silicon nitride layer 34, the first silicon oxide layer 32 and the conductive metal layer 20a sequentially, using the hard mask layer as an etching mask. The first sacrificial layer 40, the second silicon oxide layer 36, the trap silicon nitride layer 34, the first silicon oxide layer 32 and the conductive metal layer 20a are anisotropically etched by a dry etching method using a reaction gas of high reactivity. As the etching gas used for the dry etching method, a CxFy series gas or a carbon fluoride series gas, such as a CaHbFc series gas, may be used. The carbon fluoride series gas may be a gas such as CF4, CHF3, C2F6, C4F8, CH2F2, CH3F, CH4, C2H2 or C4F6, or a mixture thereof. The write word line 20, the trap site 30 and the first sacrificial layer 40 are patterned to have a predetermined critical dimension and are stacked in structure.

Figure 7C:
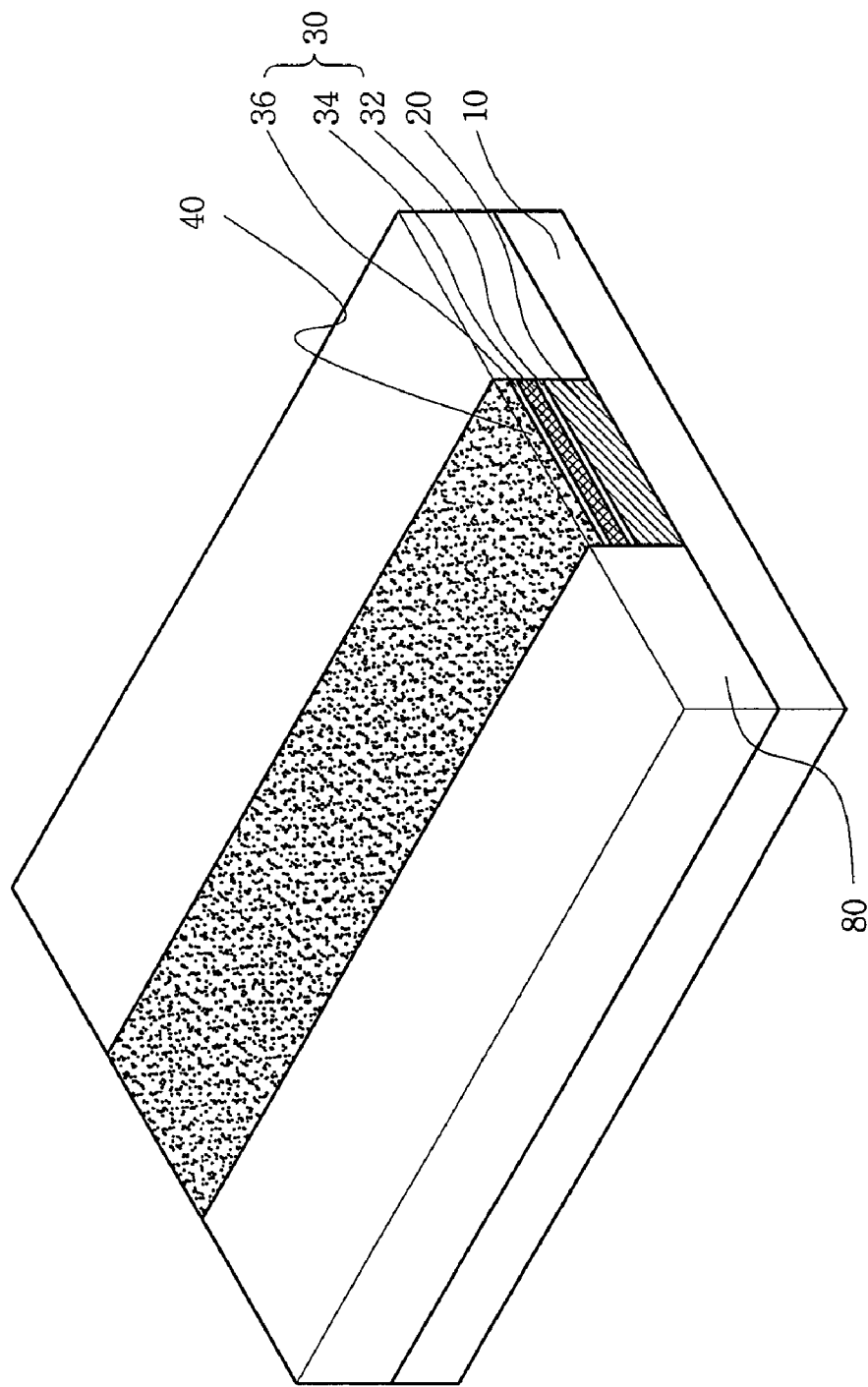
Figure 8C:
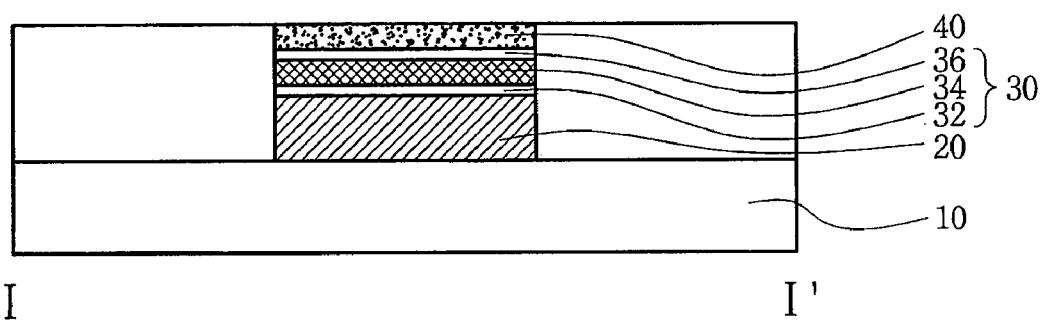
Figure 9C:
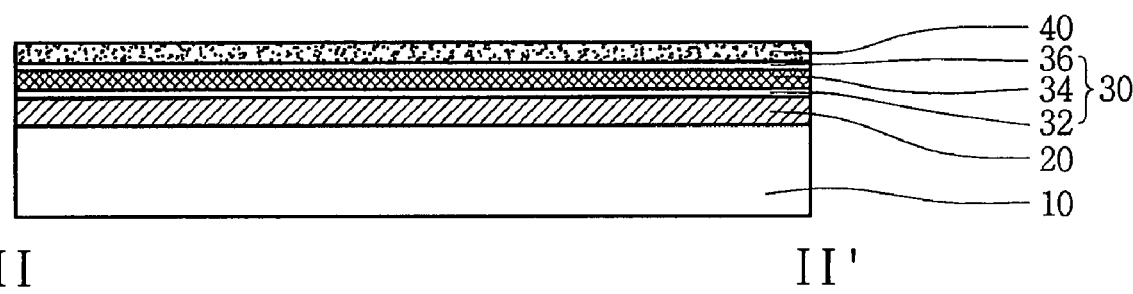

As illustrated in FIGS. 7C, 8C and 9C, a first interlayer insulating layer 80 is formed to a predetermined thickness on the entire surface of the substrate 10 on which the first sacrificial layer 40 is formed. The first interlayer insulating layer 80 is removed to be flat and to expose the first sacrificial layer 40, so that the write word line 20 and the trap site 30 are buried and the first sacrificial layer 40 is selectively exposed. The first interlayer insulating layer 80 is formed to provide a flat upper surface so that the bit line 50 and the read word line 70 to be formed subsequently are formed to cross the write word line 20 on the first sacrificial layer 40. For example, the first interlayer insulating layer 80 is made of the silicon oxide layer formed by the TEOS, USG, SOG or HDP-CVD method and formed to a thickness of about 700 Å to 1500 Å. The first interlayer insulating layer 80 may be planarized, for example, by a chemical mechanical polishing method.

Figure 7D:
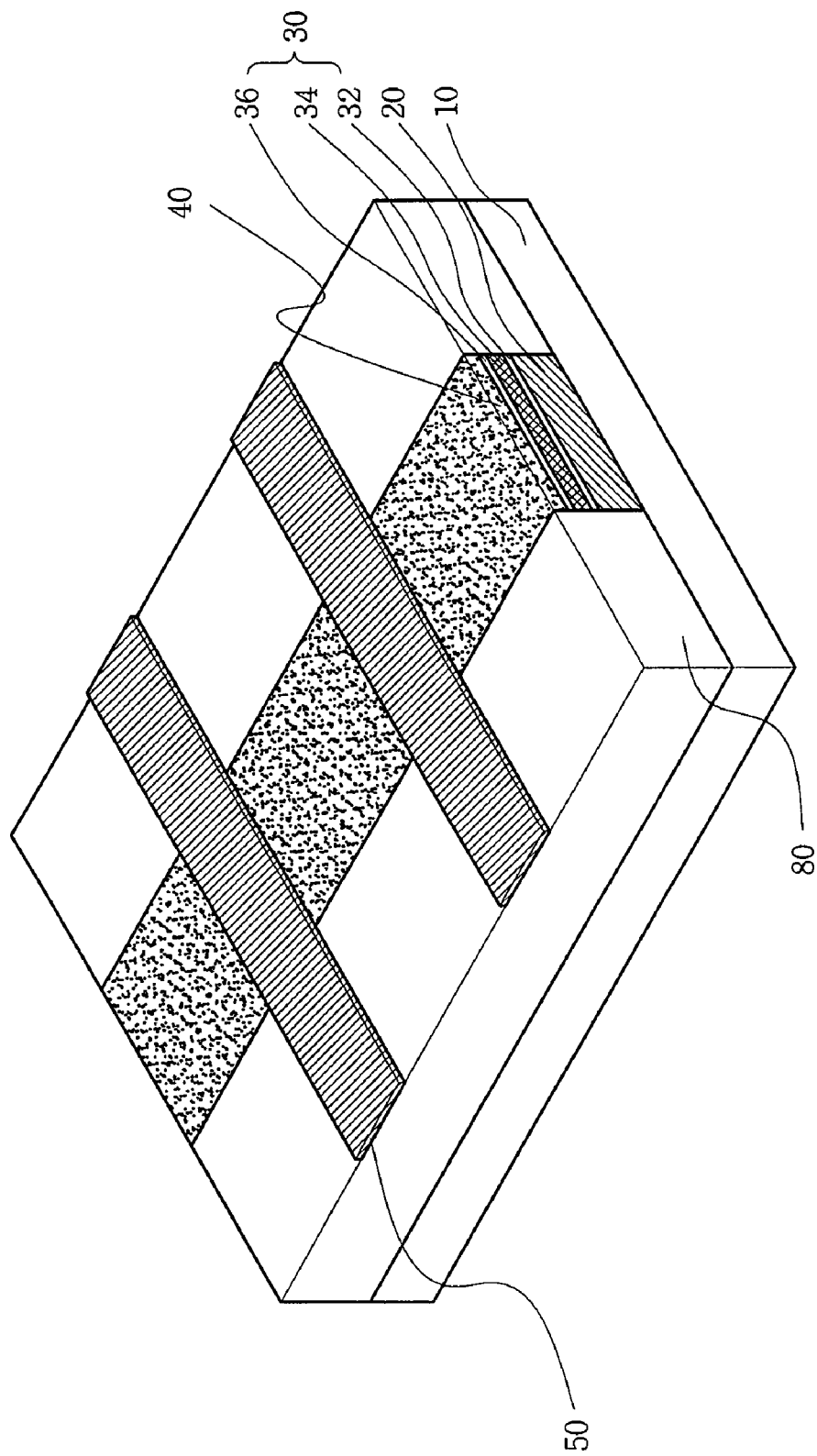
Figure 8D:
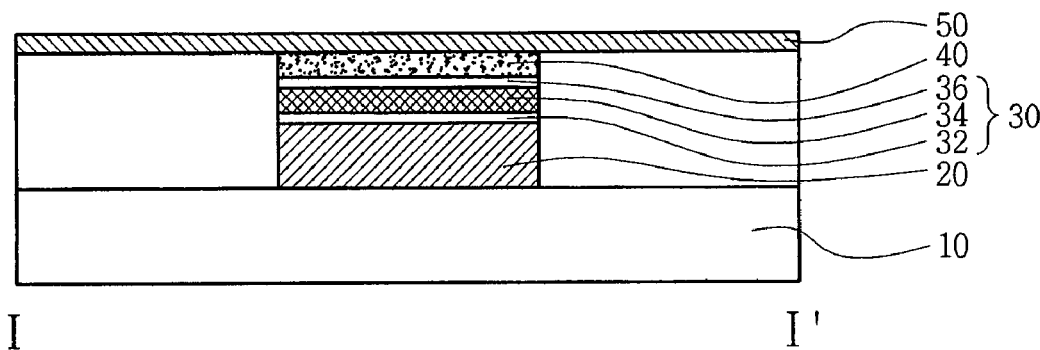
Figure 9D:
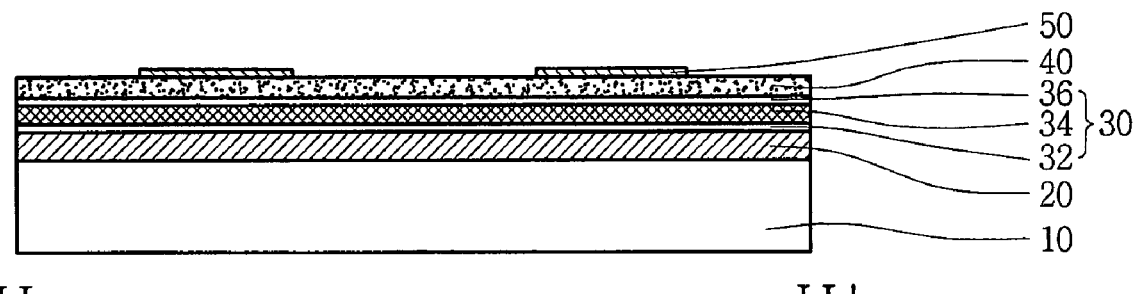

As illustrated in FIGS. 7D, 8D and 9D, the bit line 50, in this case, multiple bit lines, is formed to extend in a second direction that intersects, or crosses over the first sacrificial layer 40, the trap site 30 and the write word line 20 formed to extend in the first direction. For example, the bit line 50 is made of a conductive metal, such as titanium or titanium nitride, or a carbon nanotube and is formed to a thickness of about 10 Å to 200 Å. In one example, the bit line 50 is formed by forming a layer of a conductive metal, such as titanium or titanium nitride, or carbon nanotube on the entire surface of the substrate 10; forming a photo-resist pattern having a predetermined critical dimension in the direction crossing the write word line 20 and the trap site 30 on the conductive metal or carbon nanotube layer; and anisotropically etching the conductive metal or carbon nanotube layer by the dry etching method using the photo-resist pattern as an etching mask. The conductive metal layer, such as a titanium or titanium nitride layer may be formed by the physical vapor deposition method or the chemical vapor deposition method such as a plasma enhanced chemical vapor deposition method or a high density plasma chemical vapor deposition method, and the carbon nanotube layer may be formed by an electric discharge method.

Figure 7E:
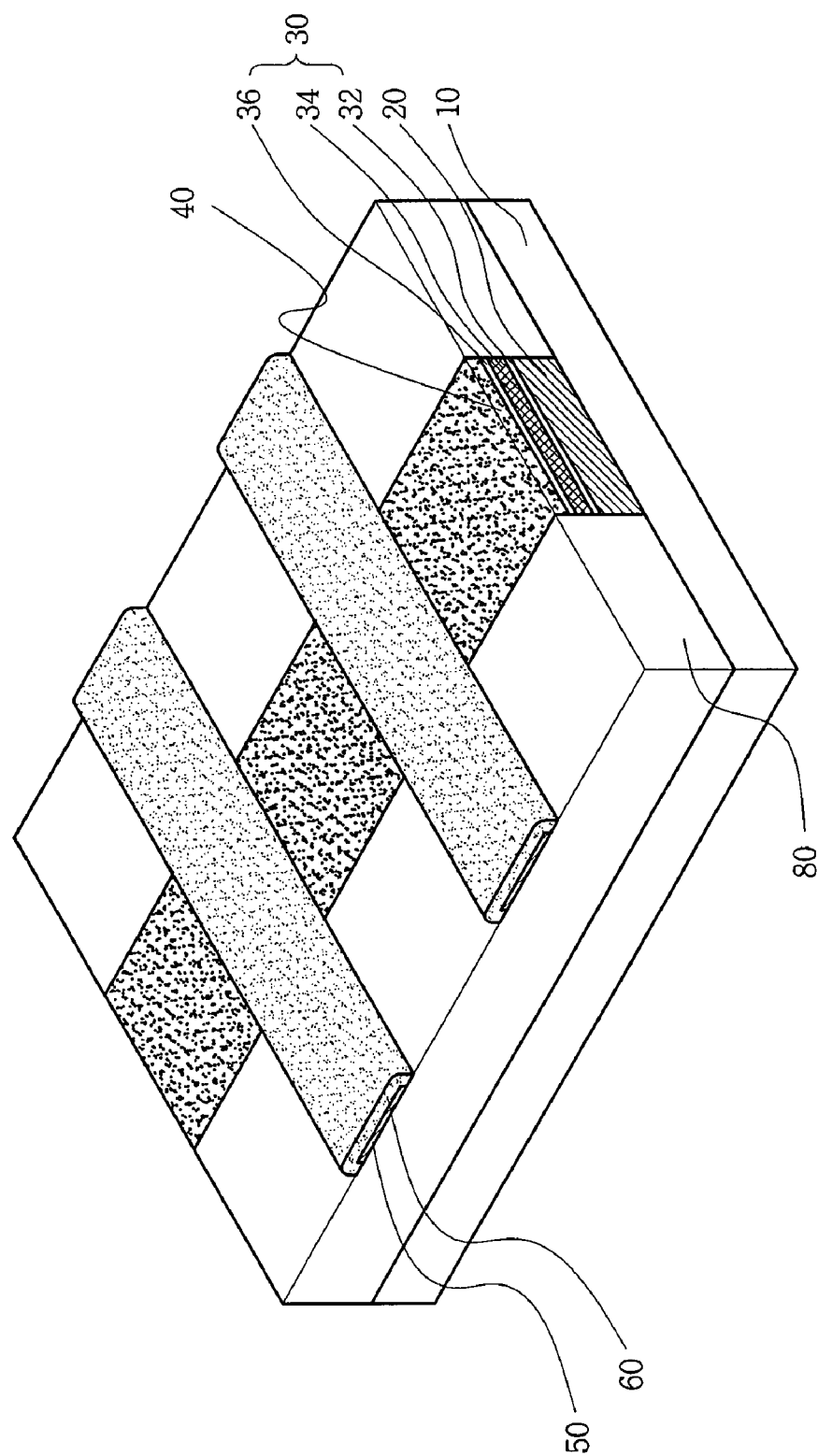
Figure 8E:
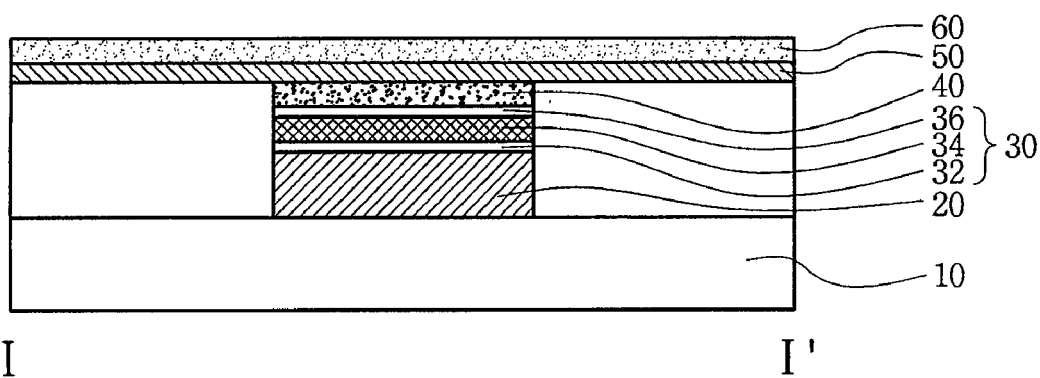
Figure 9E:
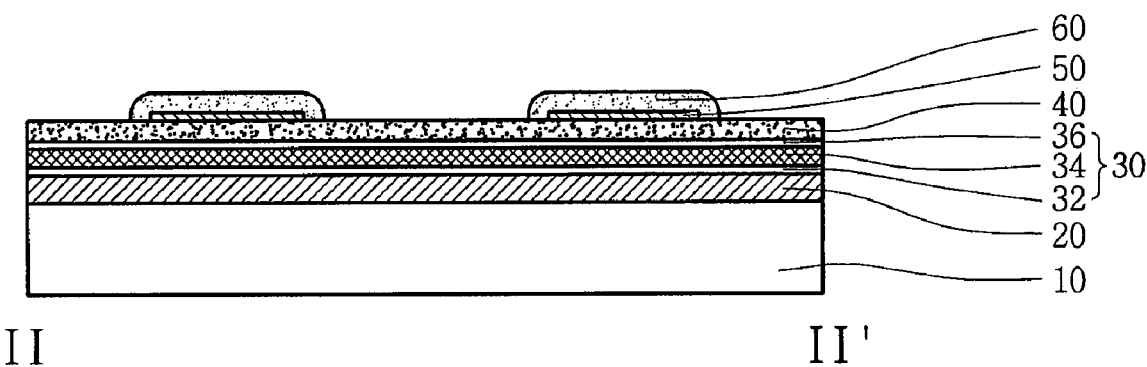

As illustrated in FIGS. 7E, 8E and 9E, a second sacrificial layer 60 is formed to cover the upper part and sides of the bit line 50 on the first sacrificial layer 40. The second sacrificial layer 60 is formed on the bit line 50 so that the read word line 70 to be formed subsequently, and the bit line 50, are spaced apart from each other. When the second sacrificial layer 60 is subsequently removed, the bit line 50 and the read word line 70 may be formed to be spaced apart from each other by the distance corresponding to the thickness of the second sacrificial layer 60. For example, the second sacrificial layer 60 is formed to a predetermined thickness on the entire surface of the substrate 10 on which the bit line 50 is formed. The second sacrificial layer 60 can be formed, for example, by an anisotropic etching process, by the dry etching method using the photo-resist pattern masking the sides and upper parts of the bit line 50 as an etching mask. The second sacrificial layer 60 is formed to have a thickness that is the same as, or similar to, the thickness of the first sacrificial layer 40. For example, the second sacrificial layer 60 is composed of a poly silicon material formed by the chemical vapor deposition method, like the first sacrificial layer 40, and is formed to a thickness of about 10 Å to 300 Å. When the bit line 50 is formed to a predetermined thickness or less, the second sacrificial layer 60 formed by the chemical vapor deposition method may be formed to overcome a difference in thickness from the bit line 50. The second sacrificial layer 60 may be formed to be in contact with the first sacrificial layer 40 and may be easily removed along with the first sacrificial layer 40 during a subsequent removal process. The second sacrificial layer 60 may be formed to extend in the second direction on the substrate 10 adjacent to both edges of the first sacrificial layer 40.

Figure 7F:
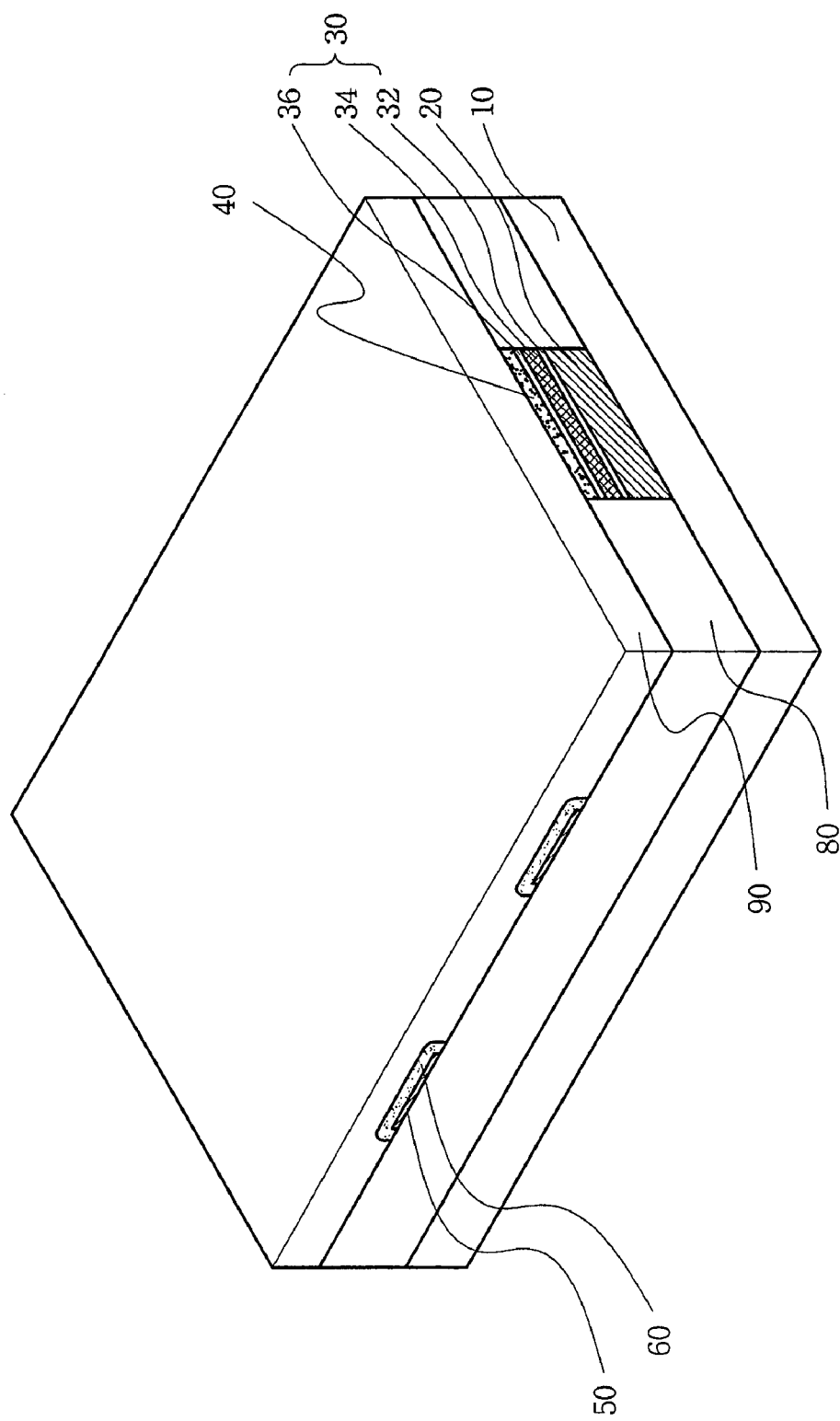
Figure 8F:
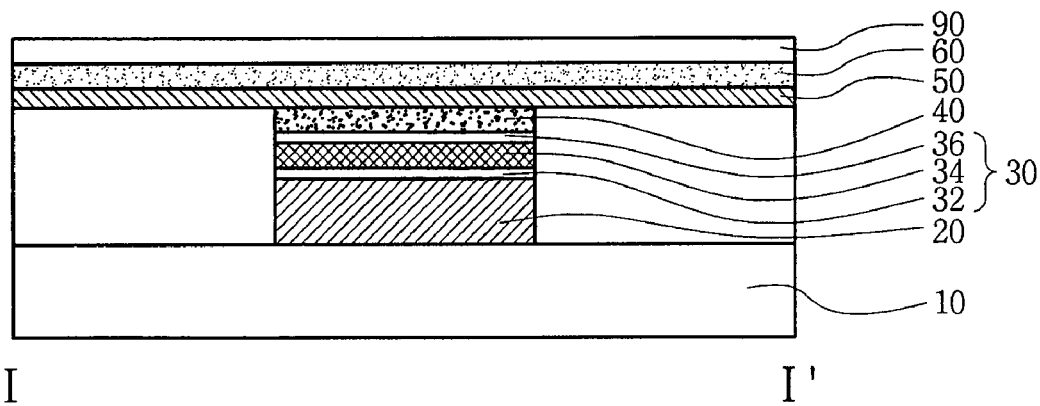
Figure 9F:
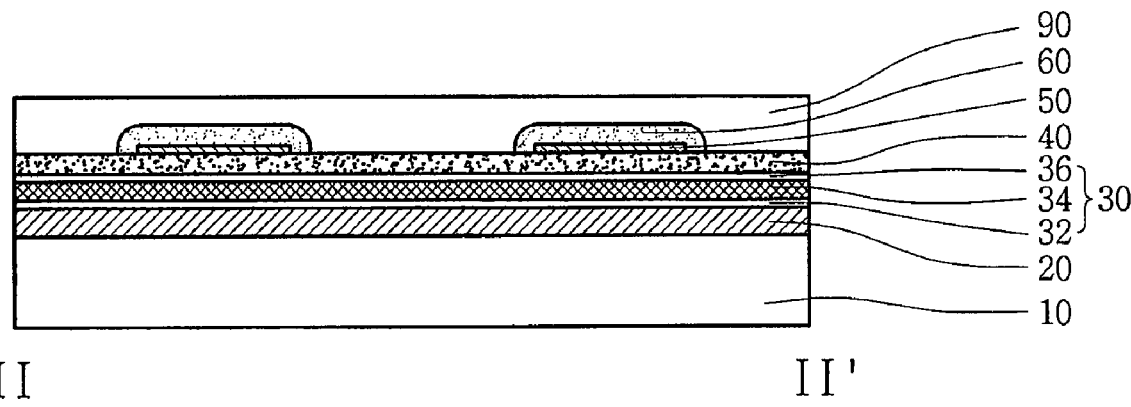
Figure 9G:
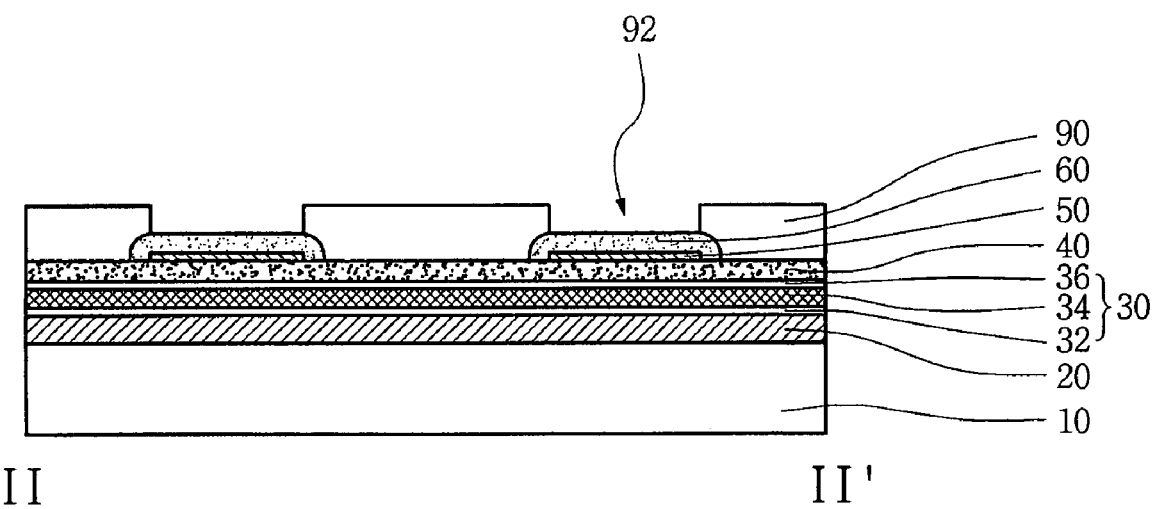

As illustrated in FIGS. 7F, 8F and 9F, a second interlayer insulating layer 90 is formed on the entire surface of the substrate 10 on which the second sacrificial layer 60 is formed. The second interlayer insulating layer 90 is planarized, or flattened. The second interlayer insulating layer 90 buries the second sacrificial layer 60 and is formed to a thickness that will later define the thickness of the read word line 70 to be formed on the second sacrificial layer 60. The second interlayer insulating layer 90 insulates and supports the sides of the read word line 70. For example, the second interlayer insulating layer 90 is formed of a silicon oxide layer formed by the TEOS, USG, SOG or HDP-CVD method and is formed to a thickness of about 700 Å to 1500 Å. The second interlayer insulating layer 90 may be planarized by the chemical mechanical polishing method. The second interlayer insulating layer 90 may be planarized by time-etching so as to remain to a predetermined thickness on the second sacrificial layer 60.

Figure 7G:
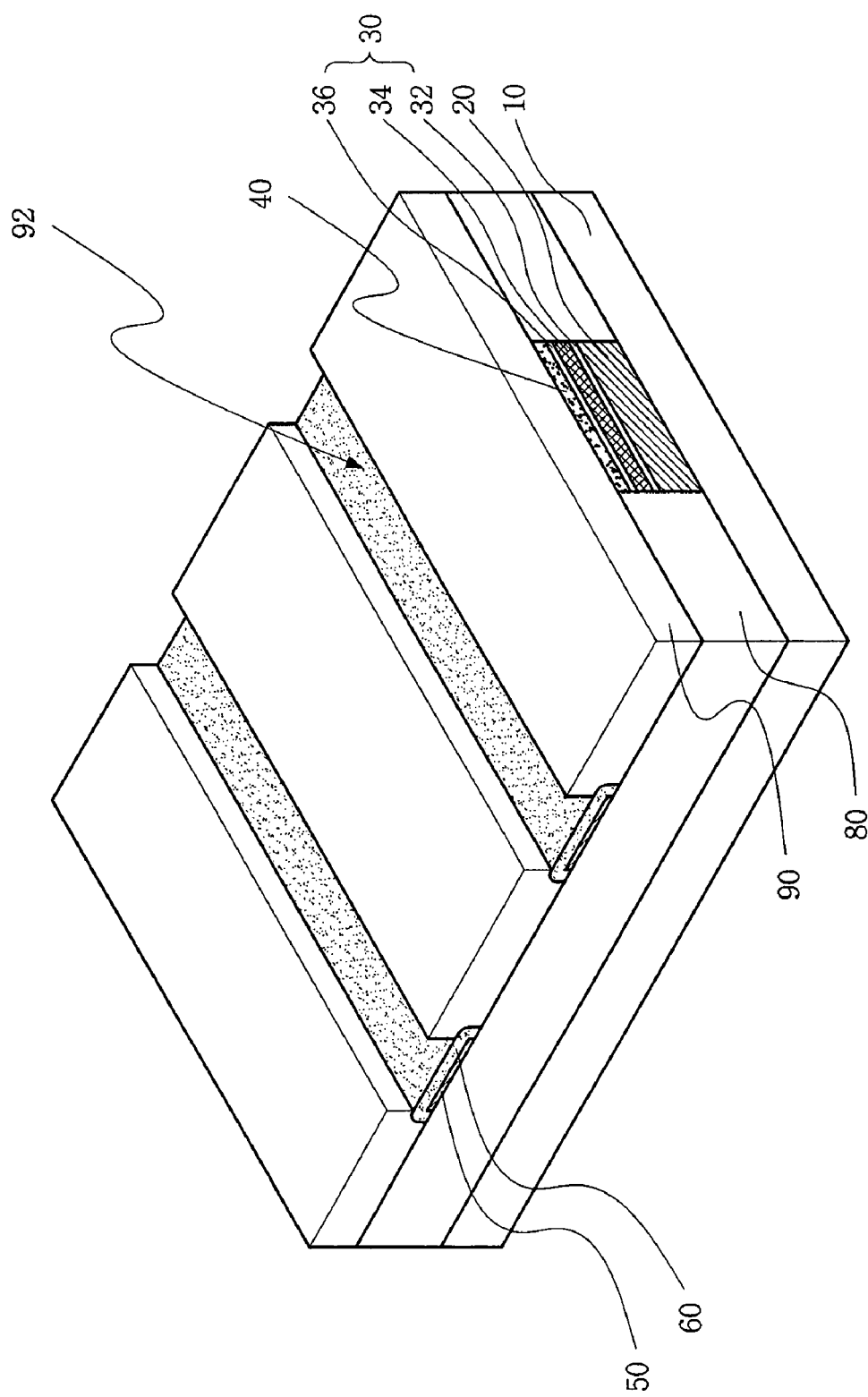
Figure 8G:
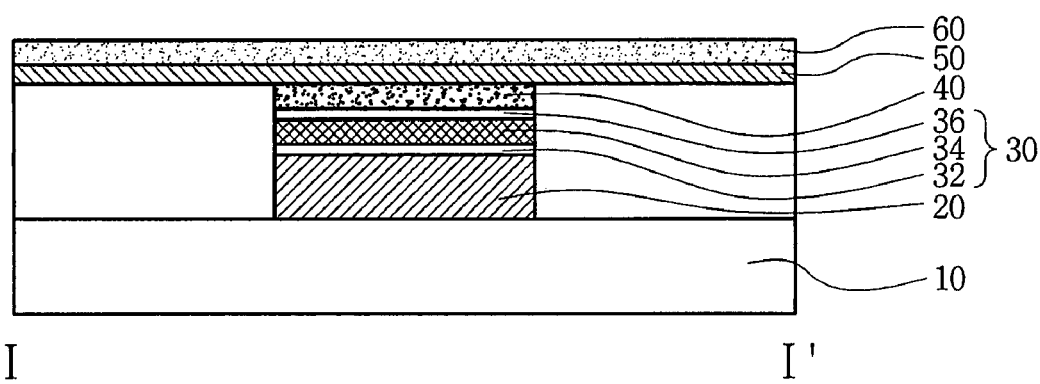

As illustrated in FIGS. 7G, 8G and. 9G, a groove 92 is formed in the second interlayer insulating layer 90 at a predetermined depth so that the second sacrificial layer 60 is exposed, by removing the second interlayer insulating layer 90 on the second sacrificial layer 60. The depth of the groove 92 corresponds to the thickness of the read word line 70 to be formed subsequently on the second sacrificial layer 60. The critical dimension of the groove 92 corresponds to the critical dimension of the read word line 70. For example, the groove 92 is formed by anisotropically removing the second interlayer insulating layer 90 by the dry etching method using, as the etching mask, the photo-resist pattern or the hard mask layer, which selectively exposes the second interlayer insulating layer 90 on the second sacrificial layer 60, until the second sacrificial layer 60 is exposed. The groove 92 is formed to a depth of about 200 Å to 500 Å. A part of the second interlayer insulating layer 90 on the second sacrificial layer 60 which does not cross the write word line 20 may not be selectively removed. For example, the part of the second interlayer insulating layer 90 which is not removed on the second sacrificial layer 60 becomes a spacer (not shown) which allows a vacant space positioned between the bit line 50 and the read word line 70 to be spaced apart therefrom at a predetermined interval.

Figure 7H:
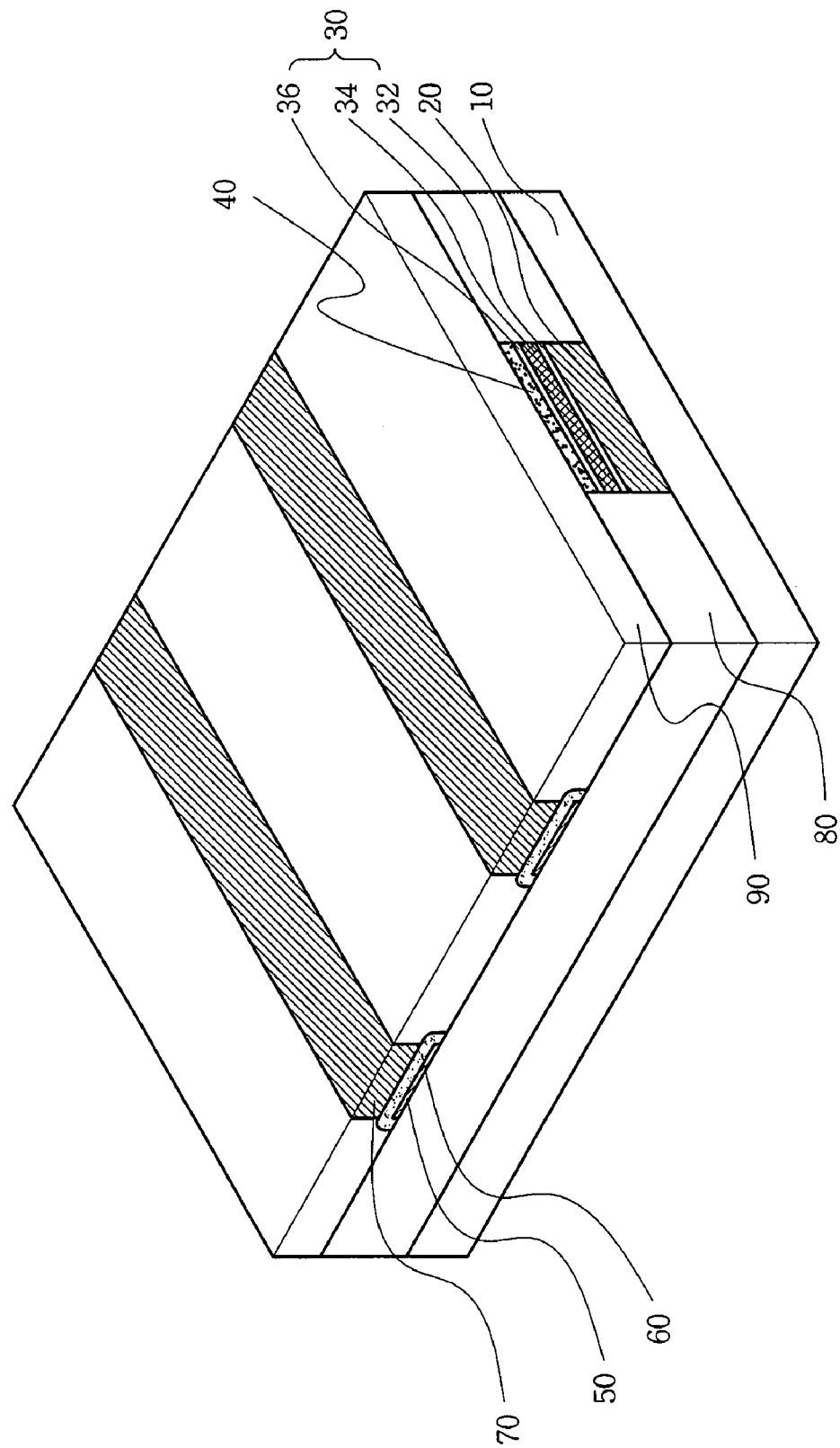
Figure 8H:
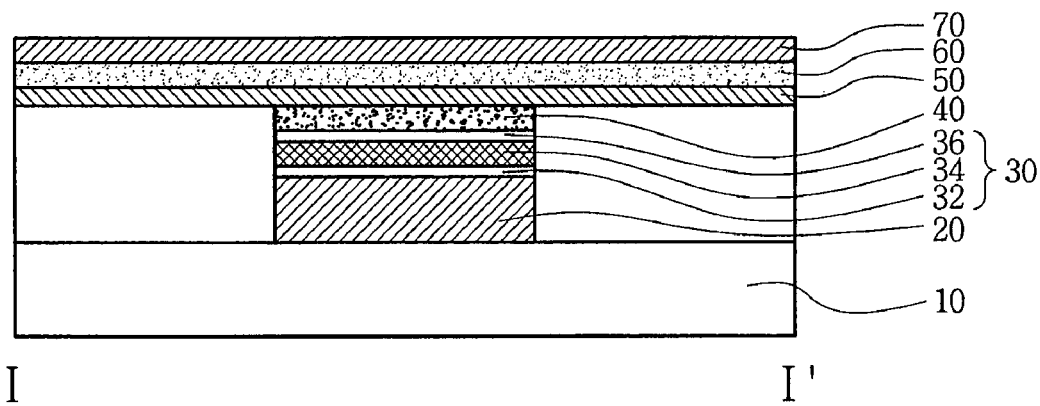
Figure 9H:
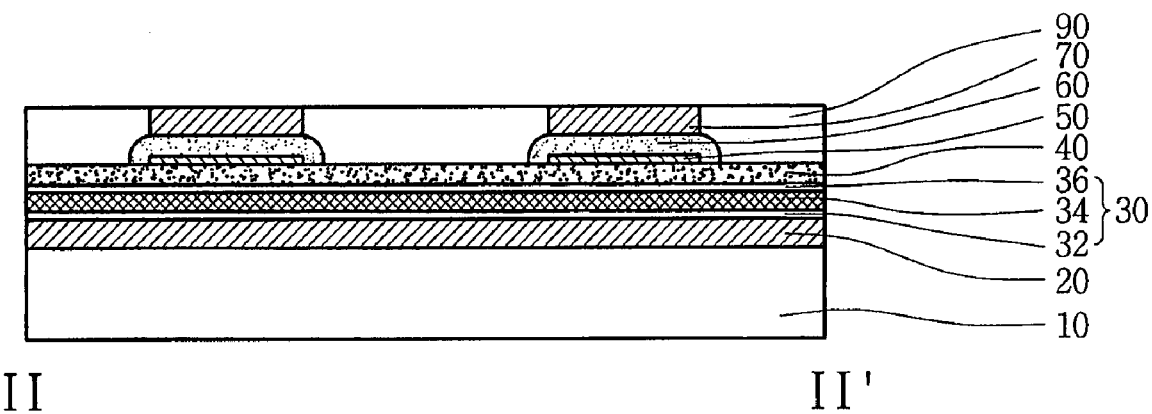

As illustrated in FIGS. 7H, 8H and 9H, the read word line 70 is formed within the groove 92 by forming a conductive metal layer, to a predetermined thickness, on the entire surface of the substrate 10 on which the groove 92 is formed, and by removing the conductive metal layer to be flattened to expose the second interlayer insulating layer 90. The read word line 70 is formed in a direction parallel to the bit line 50 and the second sacrificial layer 60. The read word line 70 is formed to be same as or similar to the bit line 50 in the critical dimension. For example, the read word line 70 may be formed by a damascene method of forming the conductive metal layer within the groove 92. Like the write word line 20, the read word line 70 may be composed of a metal material, such as gold, silver, copper, aluminum, tungsten, tungsten silicide, titanium, titanium nitride, tantalum or tantalum silicide. Copper is preferably employed to form the read word line 70, which can be fabricated using the damascene method performed without an etching gas or an etching solution of low etch selectivity.

Although not shown, the read word line 70 may be patterned in the direction parallel to the bit line 50 on the second sacrificial layer 60 before the second interlayer insulating layer 90 is formed. The second interlayer insulating layer 90 may be formed on the entire surface of the substrate 10 on which the read word line 70 is formed, and the second interlayer insulating layer 90 may be removed to be flattened so that the read word line 70 is exposed.

Figure 7I:
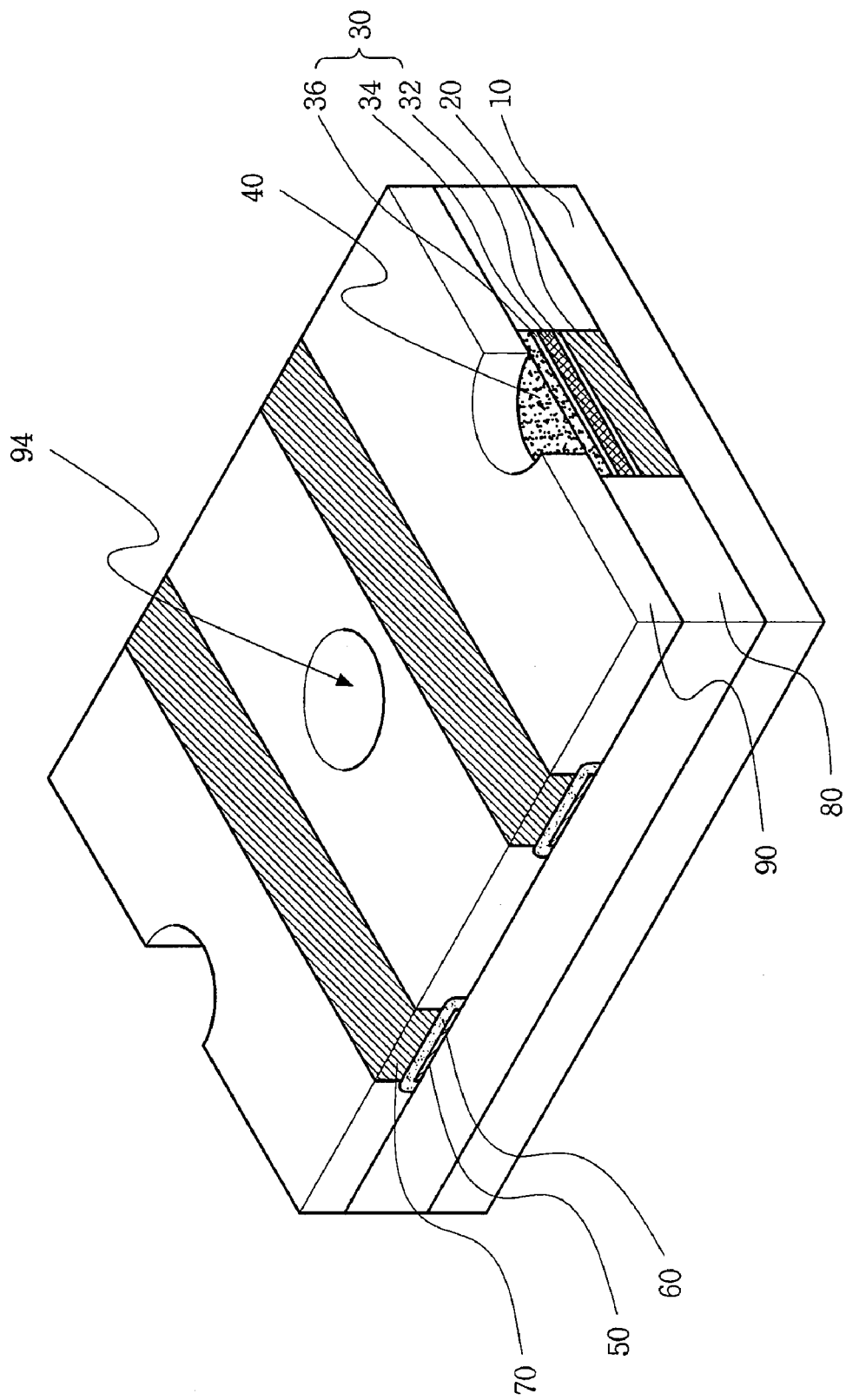
Figure 8I:
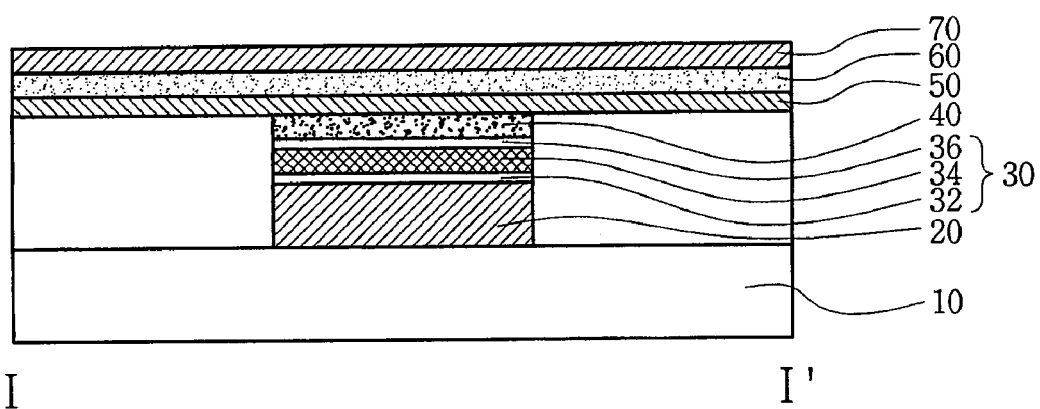
Figure 9I:
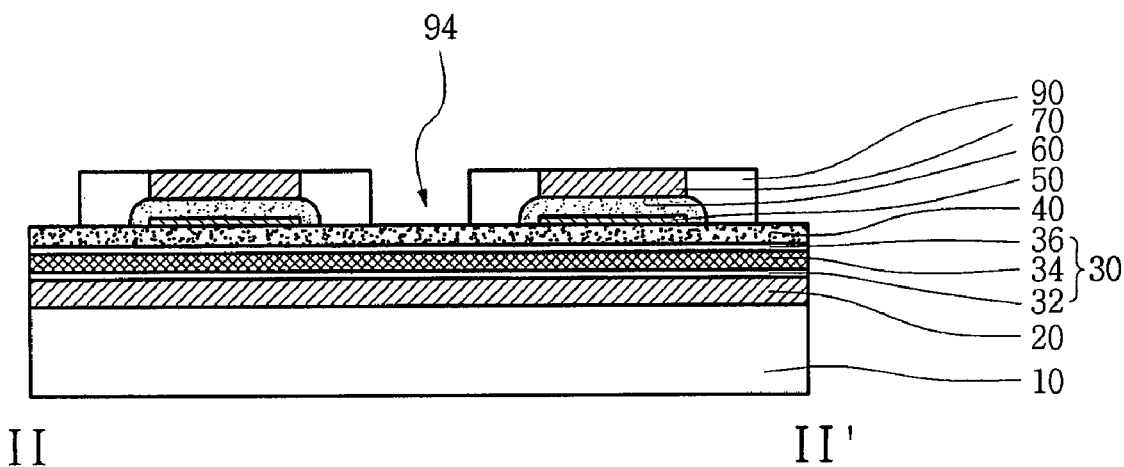

As illustrated in FIGS. 7I, 8I and 9I, a trench 94 is formed to expose the first sacrificial layer 40 and the second sacrificial layer 60 connected to the first sacrificial layer 40, by removing a portion of the second interlayer insulating layer 90 on the write word line 20, the trap site 30 and the first sacrificial layer 40 in a region that does not cross over, or intersect, the read word line 70. For example, the trench 94 is formed by anisotropically removing the second interlayer insulating layer 90, by the dry etching method using, as the etching mask layer, the photo-resist pattern or the hard mask layer, which selectively exposes the second interlayer insulating layer 90 on the first sacrificial layer 40 in a region that does not cross the read word line 70, so that the first sacrificial layer 40 is exposed. The trench 94 may optionally be formed to extend in the direction parallel to the read word line 70 and to have a line shape to expose a larger region of the first sacrificial layer 40 between the read word lines 70. The dry etching method may use an etching gas of higher etch selectivity with respect to the second interlayer insulating layer 90 than the first sacrificial layer 40. Since the trench 94 is formed to remove the first sacrificial layer 40 and the second sacrificial layer 60 below the second interlayer insulating layer 90, it should be formed so that the first sacrificial layer 40 and the second sacrificial layer 60 are exposed on the bottom or sidewalls of the trench 94. Since the first sacrificial layer 40 is composed of the same or similar material as that of the second sacrificial layer 60, the first sacrificial layer 40 can be removed by a wet etching method of removing the second sacrificial layer 60 subsequently. Thus, the first sacrificial layer 40 only may be exposed in the trench 94. Further, the trench 94 may include a hole which is formed to expose the surface of the first sacrificial layer 40 by removing a part of the second interlayer insulating layer 90 on the write word line 20, the trap site 30 and the first sacrificial layer 40 which do not cross the bit line 50. The trench 94 is formed to allow the etching solution or etching gas, which is used for removing the first sacrificial layer 40 and the second sacrificial layer 60, to flow into the second interlayer insulating 90, by removing the second interlayer insulating layer 90 in a line shape or a hole shape to expose the first sacrificial layer 40 or the second sacrificial layer 60.

Figure 7J:
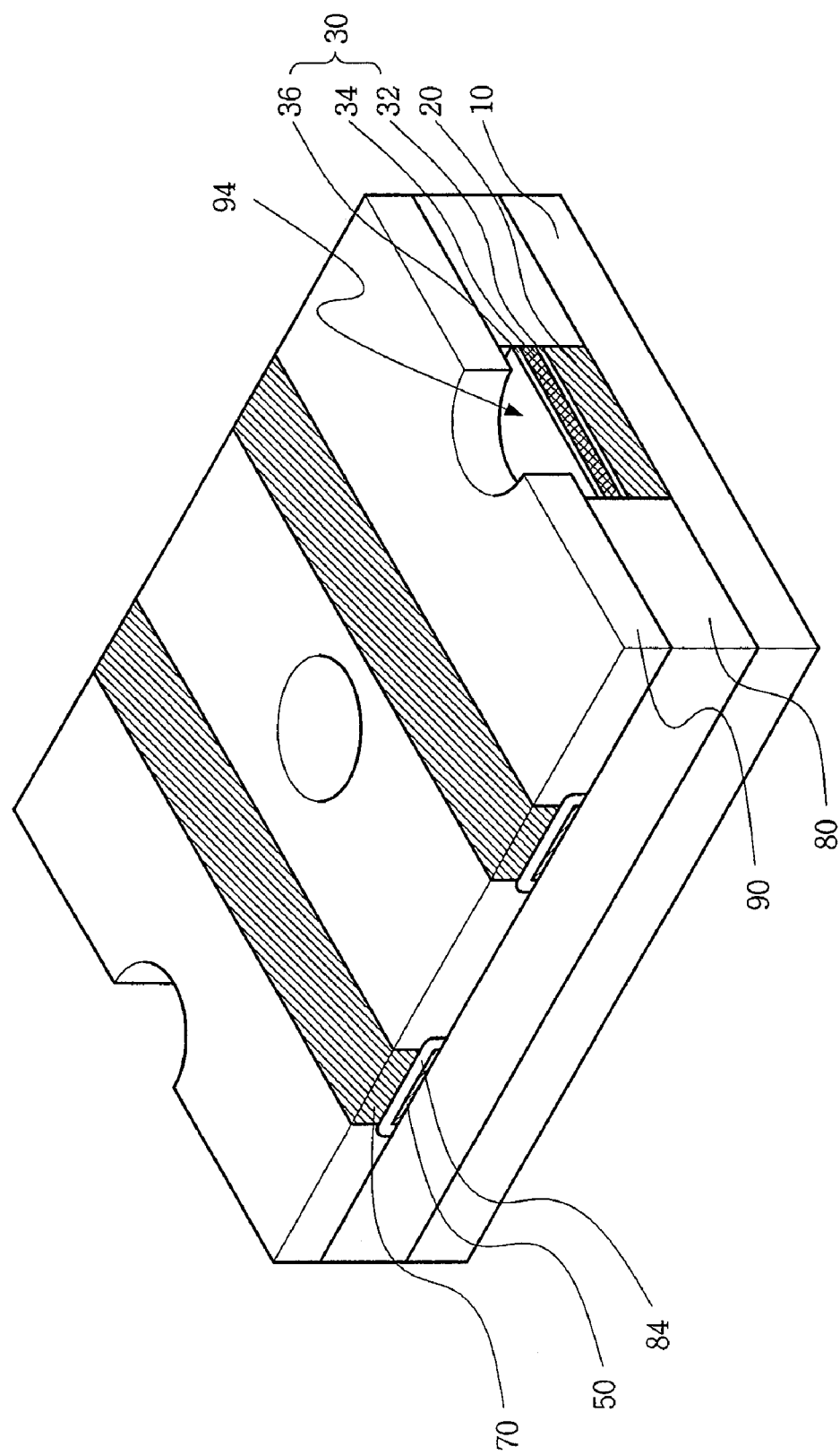
Figure 8J:
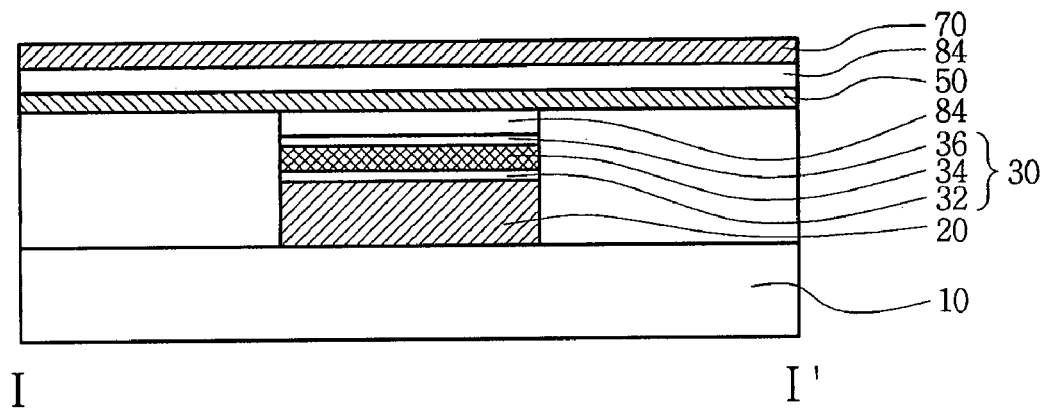
Figure 9J:
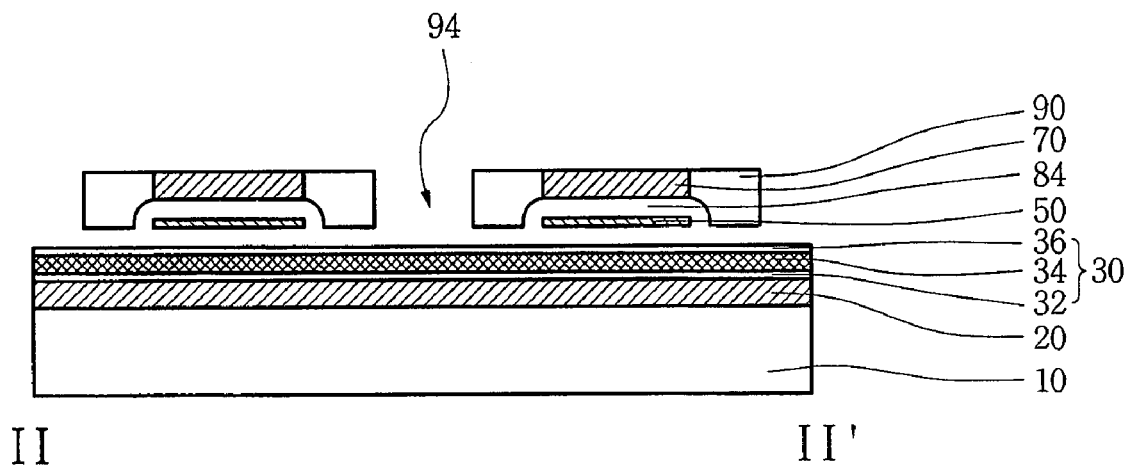

As illustrated in FIGS. 7J, 8J and 9J, a predetermined vacant space 84 is formed by removing the first sacrificial layer 40 and the second sacrificial layer 60 exposed in the bottom or sidewalls of the trench 94. In the vacant space 84, the bit line 50 is disposed to be spaced apart from and between the trap site 30 and the read word line 70. For example, the first sacrificial layer 40 and the second sacrificial layer 60 may be isotropically etched from their surfaces exposed on the sidewalls of the trench 94 to their sides by the wet etching method or dry etching method. The etching solution used for the wet etching method of the first sacrificial layer 40 and the second sacrificial layer 60, which are made of a poly silicon material, is composed of a mixed solution in which a strong acid, such as a nitric acid, a fluoric acid or an acetic acid, is mixed with deionized water at a predetermined concentration. The etching gas used for the dry etching method of the poly silicon material may be a gas, such as CF4, CHF3, C2F6, C4F8, CH2F2, CH3F, CH4, C2H2 or C4F6 or a mixture thereof. During the etching process, the etching solution or the etching gas removes the first sacrificial layer 40 and the second sacrificial layer 60 between the read word line 70 and the trap site 30 while forming the predetermined vacant space 84 therebetween. That is, the bit line 50 passes through the middle of the vacant space 84 between the read word line 70 and the trap site 30.

Figure 7K:
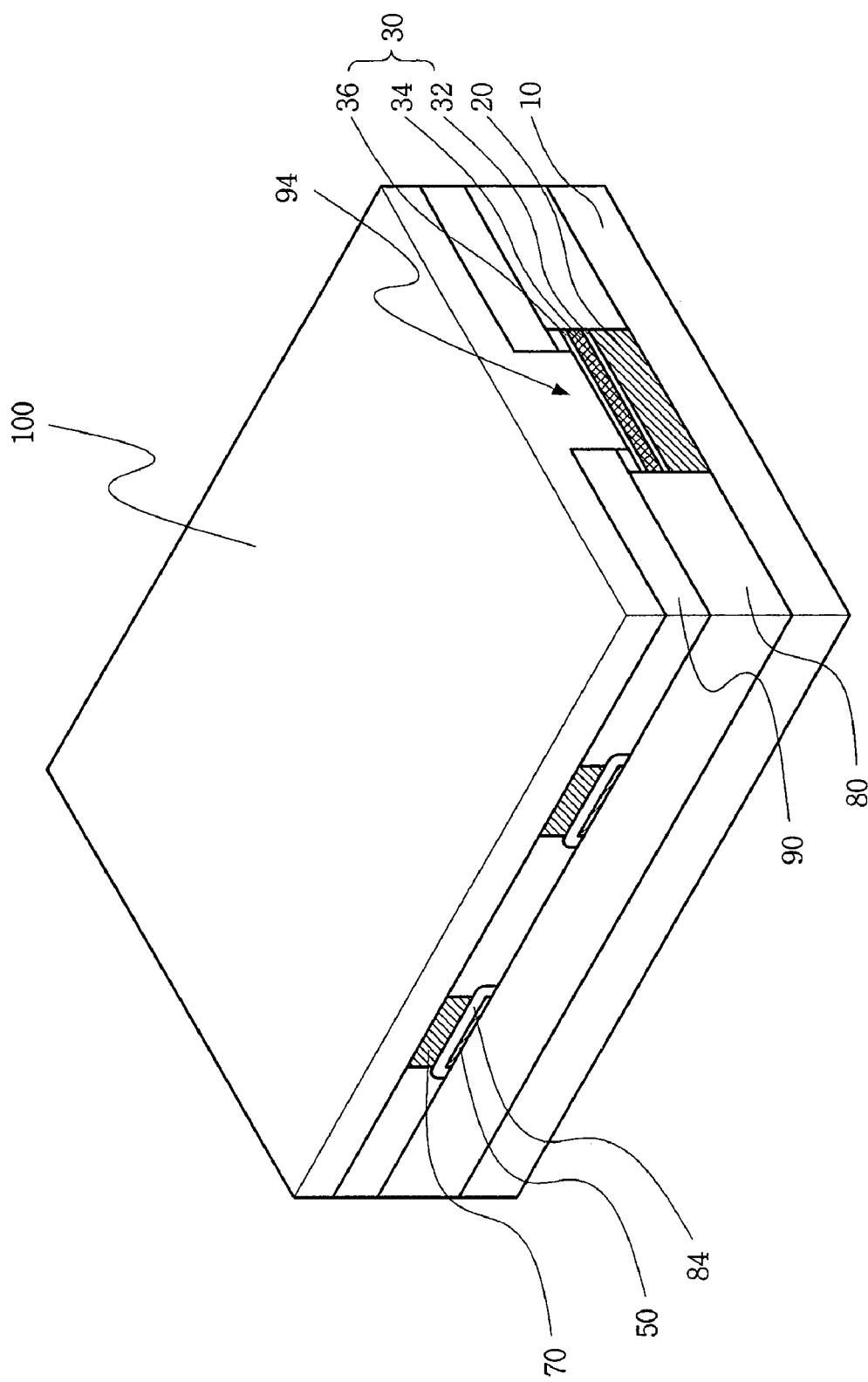
Figure 8K:
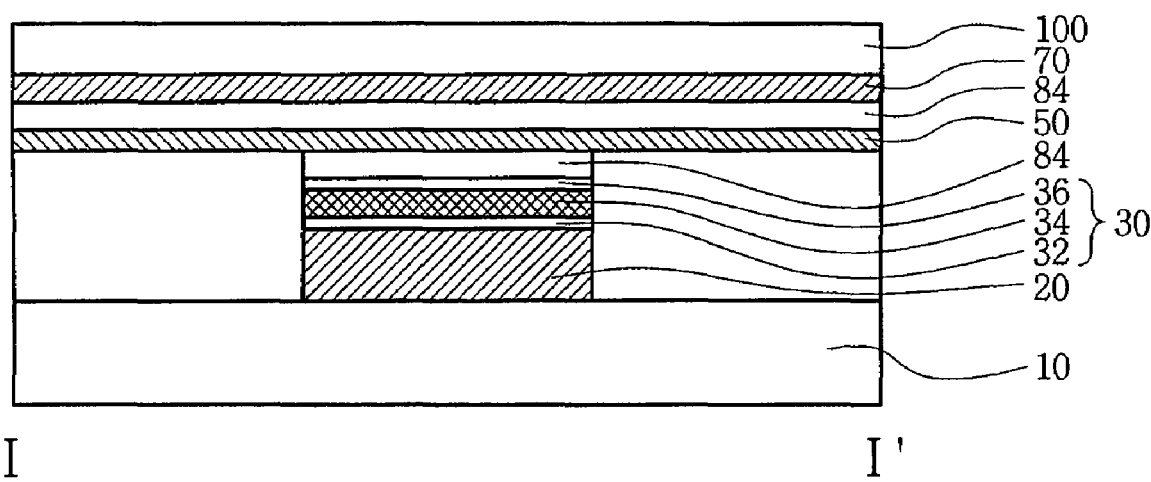
Figure 9K:
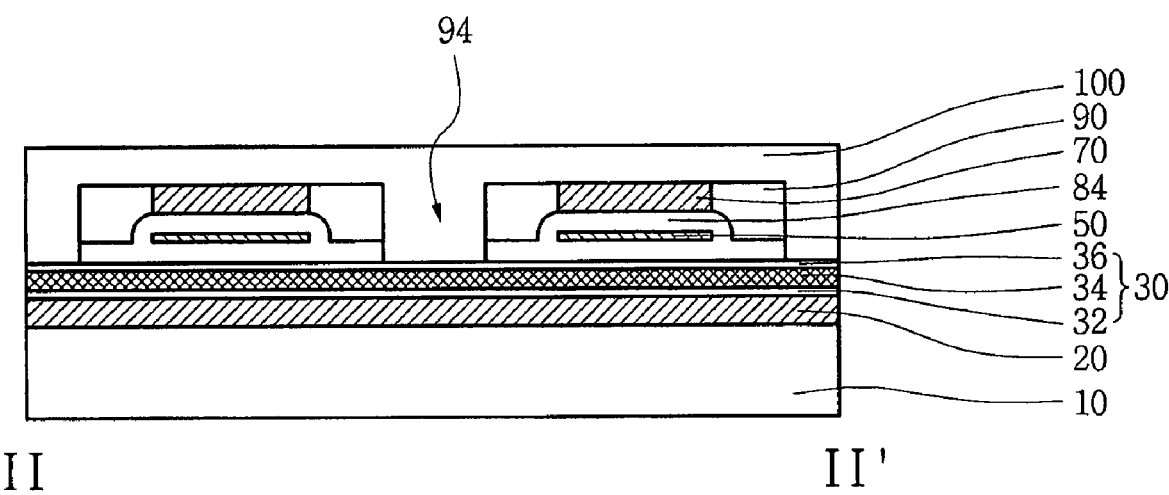

As illustrated in FIGS. 7K, 8K and 9K, a third interlayer insulating layer 100 is formed, to a predetermined thickness, on the substrate 10, to bury the trench 94. The third interlayer insulating layer 100 should not be formed in the vacant space 84 under the bit line 50, so as not to interfere with the deflecting operation of the bit line 50. The third interlayer insulating layer 100 is stacked from the bottom of the trench 94 and is formed through a process having low step coverage so that the third interlayer insulating layer 100 cannot be grown toward the sidewalls of the trench 94. For example, the third interlayer insulating layer 100 is made of a silicon oxide layer, a silicon oxynitride layer or an organic electroluminescent layer formed by the physical vapor deposition (PVD) method, the chemical vapor deposition (CVD) method, the molecular beam epitaxy (MBE) method or the liquid phase epitaxy (LPE) method. As the diameter of, or the region exposed by, the trench 94 is larger, the third interlayer insulating layer 100 is formed to a greater amount inside the vacant space 84 because a gas or fluid including the material to form the third interlayer insulating layer 100 flows more readily into the vacant space 84 between the trap site 30 and the read word line 70 through the sidewalls of the trench 94. Accordingly, as the diameter of the trench 94 becomes smaller, the inflow amount of the material, which will form third interlayer insulating layer 100, into the vacant space 84 between the trap site 30 and the read word line 70 is reduced. Further, as the trench 94 is formed to be farther apart from the vacant space 84 between the trap site 30 and the read word line 70, the inflow amount of the material, which will form the third interlayer insulating layer 100, into the vacant space 84 is reduced. In another, optional embodiment (not shown), the second interlayer insulating layer 90 may not be buried down to the bottom of the trench 94 and it may be formed to block the upper end of the trench 94, so that the trench 94 forms a large cavity (not shown).

Then, the third interlayer insulating layer 100 used to bury the trench 94 is planarized, and another write word line 20, another trap site 30, another bit line 50, and another read word line 70 can be sequentially formed on the third interlayer insulating layer 100, thereby to fabricate the non-volatile memory device in a multi-layered structure, for example, as shown in FIG. 6 above.

Consequently, the method of fabricating the non-volatile memory device according to the embodiment of the present invention is performed by: forming the write word line 20 and the trap site 30, at the predetermined critical dimensions, in a first direction of extension on the substrate 10; forming the bit line 50 being disposed to be spaced apart from the write word line 20 and the trap site 30 at the predetermined height; and forming the read word line 70 to include the predetermined vacant space 84 on the bit line 50 and to be disposed in a direction that is the same as, or similar to, the bit line 50, so that the bit line 50 can be used to write or read information corresponding to whether the bit line 50 is in contact with the trap site 30 or not, to increase or maximize the productivity and efficiency of the resulting device.

In accordance with embodiments of the present invention, a non-volatile memory device comprises the trap site which allows the electric charge applied to the write word line to be tunneled to be trapped and maintains the state of deflection of the bit line, using the trapped electric charge. Therefore, the consumption of standby power to be applied to store predetermined information is reduced and the predetermined information is retained, even when no electric charge is supplied through the write word line, thereby increasing or maximizing the productivity and efficiency of the resulting device.

Furthermore, the non-volatile memory device comprises a trap site which is formed to make contact with the bit line under deflection in a vertical direction and to be insulated from the bit line. Therefore, the information corresponding to whether the bit line is in contact with the trap site can be clearly written and erased, thereby increasing or maximizing the reliability and efficiency of the device.

While the invention have been particularly shown and described with reference to preferred embodiments thereof, it will be understood by those skilled in the art that various changes in form and detail may be made herein without departing from the spirit and scope of the invention as defined by the appended claims.

What is claimed is:

1. A non-volatile memory device comprising:
   a first word line and a second word line insulated from each other and positioned to intersect each other with a vacant space therebetween;
   a bit line in the vacant space between the first word line and the second word line and positioned in parallel with one of the first word line and the second word line, the bit line constructed and arranged to be deflected toward one of the first word line and the second word line by an electric field induced between the first word line and the second word line; and
   a trap site between the bit line and one of the first word line and the second word line intersecting the bit line, the trap site being insulated from the one of the first word line and the second word line intersecting the bit line and spaced apart from the bit line by a portion of the vacant space, the trap site configured to trap a predetermined electric charge to electrostatically fix the bit line in a deflected position in the direction of the one of the word lines.

2. The non-volatile memory device according to claim 1, further comprising:
   a substrate on which one of the first and second word lines is formed;
   a first interlayer insulating layer that supports the bit line in a position that is spaced apart from, and above, the one of the first and second word lines and the trap site formed on the substrate; and
   a second interlayer insulating layer that supports the other of the first and second word lines.

3. The non-volatile memory device according to claim 1, wherein the trap site has a structure in which a first silicon oxide layer, a silicon nitride layer and a second silicon oxide layer are stacked.

4. A non-volatile memory device comprising:
   a substrate;
   a first word line on the substrate and extending in a first direction;
   a second word line insulated from the first word line and positioned to extend in a second direction so as to intersect the first word line, the second word line being spaced apart from the first word line by a vacant space;
   a first interlayer insulating layer and a second interlayer insulating layer on the substrate at sides of the first word line which support the second word line at a height above the first word line;
   a bit line in the vacant space above the first word line between the first and second interlayer insulating layers, the bit line extending in the second direction so as to intersect the first word line, the bit line constructed and arranged to be deflected in a direction toward one of the first word line and the second word line in response to a predetermined condition; and
   a trap site on the first word line under the bit line and spaced apart from the bit line by the vacant space, the trap site configured to trap a predetermined electric charge to electrostatically fix the bit line in a deflected position in the direction of the first word line.

5. The non-volatile memory device according to claim 4, wherein the substrate comprises an insulating substrate or a semiconductor substrate.

6. The non-volatile memory device according to claim 4, wherein at least one of the first word line and the second word line comprises gold, silver, copper, aluminum, tungsten, tungsten silicide, titanium, titanium nitride, tantalum or tantalum silicide.

7. The non-volatile memory device according to claim 4, wherein at least one of the first interlayer insulating layer and the second interlayer insulating layer comprises a silicon oxide layer formed by a TEOS, USG, SOG or HDP-CVD method.

8. The non-volatile memory device according to claim 4, further comprising:

a first sacrificial layer which is formed between the first word line and the bit line and is removed to form the vacant space; and a second sacrificial layer which is formed between the bit line and the second word line and is removed to form the vacant space.

9. The non-volatile memory device according to claim 4, wherein the bit line comprises titanium, a titanium nitride layer, or a carbon nanotube.

10. The non-volatile memory device according to claim 4, wherein the trap site has a structure in that a first silicon oxide layer formed on the first word line, a silicon nitride layer and a second silicon oxide layer are stacked.

11. The non-volatile memory device according to claim 4, further comprising: a spacer which is formed on the bit line, to allow the bit line to be spaced apart from the second word line which does not interfere with the first word line, by a predetermined interval.

12. The non-volatile memory device according to claim 8, wherein the first sacrificial layer and the second sacrificial layer comprise a polysilicon material.

13. The non-volatile memory device according to claim 8, further comprising a trench which exposes the first sacrificial layer and the second sacrificial layer by removing the second interlayer insulating layer in a region that does not interfere with the intersection region of the first word line and the second word line.

14. The non-volatile memory device according to claim 13, further comprising a third interlayer insulating layer which electrically insulates the second word line on the second interlayer insulating layer and buries the trench.

15. A method of fabricating a non-volatile memory device, comprising:

forming a first word line, a trap site and a first sacrificial layer to extend in a first direction on a substrate;

forming a first interlayer insulating layer at sidewalls of the first word line, the trap site and the first sacrificial layer;

forming a bit line on the first sacrificial layer and the first interlayer insulating layer, to extend in a second direction across the first word line, the trap site and the first sacrificial layer;

forming a second sacrificial layer covering the bit line;

forming a second interlayer insulating layer burying the second sacrificial layer to a predetermined thickness on the substrate where the second sacrificial layer is formed;

forming a second word line on the second sacrificial layer by removing the second interlayer insulating layer on the second sacrificial layer;

forming a trench exposing the first sacrificial layer and the second sacrificial layer on the first word line in a region that does not interfere with the second word line; and forming a vacant space between the bit line and the trap site on the first word line and between the bit line and the second word line by removing the first sacrificial layer and the second sacrificial layer exposed by the trench.

16. The method according to claim 15, wherein the first interlayer insulating layer is formed by forming a silicon oxide layer to bury the first word line, the trap site and the first sacrificial layer, and by removing the silicon oxide layer to be flattened so that the first sacrificial layer is exposed.

17. The method according to claim 15, further comprising:

forming a spacer by retaining a portion of the second interlayer insulating layer on the second sacrificial layer that does not interfere with the first word line, so that the bit line and the second word line are maintained to be spaced apart from each other by a predetermined distance, when the second sacrificial layer is removed.

18. The method according to claim 15, wherein the second word line is formed by a damascene method.

19. The method according to claim 15, wherein the first sacrificial layer and the second sacrificial layer exposed by the trench are removed by a wet etching method or a dry etching method having an isotropic etching characteristic.

20. The method according to claim 15, further comprising:

forming a third interlayer insulating layer to bury the trench on the second interlayer insulating layer and the second word line.

* * * * *